United States Patent [19]

Azuma et al.

[11] Patent Number: 5,612,082
[45] Date of Patent: Mar. 18, 1997

[54] PROCESS FOR MAKING METAL OXIDES

[75] Inventors: Masamichi Azuma; Michael C. Scott; Carlos A. Paz de Araujo; Larry D. McMillan, all of Colorado Springs, Colo.

[73] Assignees: Symetrix Corporation, Colorado Springs, Colo.; Matsushita Electronics Corporation, Takatsuki, Japan

[21] Appl. No.: 280,601

[22] Filed: Jul. 26, 1994

Related U.S. Application Data

[63] Continuation-in-part of Ser. No. 165,082, Dec. 10, 1993, Ser. No. 132,744, Oct. 6, 1993, Pat. No. 5,514,822, Ser. No. 981,133, Nov. 24, 1992, Pat. No. 5,423,285, and Ser. No. 965,190, Oct. 23, 1992, said Ser. No. 981,133, and Ser. No. 965,190, each is a continuation-in-part of Ser. No. 807,439, Dec. 13, 1991, abandoned.

[51] Int. Cl.$^6$ ............................ C07F 19/00; B05D 5/12
[52] U.S. Cl. .................. 427/96; 427/126.3; 427/226; 427/240; 427/380; 556/28; 556/31; 556/44; 556/64; 556/77
[58] Field of Search ....................... 427/226, 380, 427/96, 126.3, 240; 106/287.19, 287.23; 556/31, 44, 77, 28, 64

[56] References Cited

U.S. PATENT DOCUMENTS

| 4,946,710 | 8/1990 | Miller et al. | 427/126.3 |
|---|---|---|---|
| 4,950,643 | 8/1990 | Agostinelli et al. | 427/226 |
| 4,960,618 | 10/1990 | Tanitsu et al. | 427/226 |
| 5,021,398 | 6/1991 | Sharma et al. | 427/226 |
| 5,028,455 | 7/1991 | Miller et al. | 427/126.3 |
| 5,034,550 | 7/1991 | Sherif | 556/54 |
| 5,122,923 | 6/1992 | Matsubara et al. | 361/321 |
| 5,189,284 | 2/1993 | Tanashi et al. | 427/226 |
| 5,244,691 | 9/1993 | Valente et al. | 427/226 |

FOREIGN PATENT DOCUMENTS

0125507   11/1984   European Pat. Off. .

OTHER PUBLICATIONS

Kuniaki Koyama et al.; A Stacked Capacitor with $(Ba_xSr_{1-x})TiO_3$ For 256M DRAM; IEDM; Dec. 1991; pp. 32.1.1–32.1.4.

G.M. Vest et al.; Synthesis of Metallo–Organic Compounds for MOD Powders and Films; Materials Research Society Symp. Proc. vol. 60; 1986; pp. 35–42. (no mo.).

Robert W. Vest et al.; $PbTiO_3$ Films From Metalloorganic Precursors; IEEE Transactions on Ultrasonics, Ferroelectrics, and Frequency Control, vol. 35, No. 6, Nov. 1988; pp. 711–717.

J. V. Mantese et al.; Metalorganic Deposition (MOD): A Nonvacuum, Spin–on, Liquid–Based, Thin Film Method; MRS Bulletin, Oct. 1989; pp. 48–53. (no mo.).

W.W. Davison et al.; Metal Oxide Films From Carboxylate Precursors; Materials Research Society Symp. Proc. vol. 121; 1988; pp. 797–802 (no mo.).

B.M. Melnick et al.; Process Optimization and Characterization of Device Worthy Sol–Gel Based PZT for Ferroelectric Memories; Ferroelectrics, 1990, vol. 109, pp. 1–23 (no mo.).

*Primary Examiner*—Janyce Bell
*Attorney, Agent, or Firm*—Duft, Graziano & Forest, P.C.

[57] ABSTRACT

Metals are reacted in a first solvent, such as 2-methoxyethanol, to form an initial precursor comprising metal-oxide compounds dissolved in the first solvent. A second solvent, such as xylene, that does not react with the metal is added to the solution and the solution heated to distill away the first solvent and form a final precursor. The final precursor is spin-coated on an integrated circuit substrate then dried and annealed to form a thin film of a metal oxide. For metal oxides including bismuth, the bismuth precursor is added to a cold initial precursor and the final precursor is not heated after the bismuth precursor is added. The second solvent wets the substrate better than the first solvent and has a better viscosity for spin-coating, thus resulting in a denser thin film with fewer imperfections.

40 Claims, 6 Drawing Sheets

PROCESS FOR MAKING METAL OXIDES

This application is a continuation-in-part of U.S. patent applications Ser. No. 08/165,082 filed Dec. 10, 1993, Ser. No. 08/132,744 filed Oct. 6, 1993 now U.S. Pat. No. 5,514,822, Ser. No. 07/981,133 filed Nov. 24, 1992, now U.S. Pat. No. 5,423,285, and Ser. No. 07/965,190 filed Oct. 23, 1992; the latter two applications are in turn continuations-in-part of U.S. patent application Ser. No. 07/807,439 filed Dec. 13, 1991, now abandoned.

BACKGROUND OF THE INVENTION

1. Field of the Invention

The invention in general relates to the fabrication of integrated circuits, and more particularly to the formation of liquid precursor solutions and the use of the liquid precursors in the fabrication of metal oxide thin films which are included in integrated circuits.

2. Statement of the Problem

Metal oxide thin films are known to be useful in making integrated circuits. For example, barium strontium titanate, commonly referred to as BST, is known to be useful in making integrated circuit thin film capacitors having high dielectric constants. See for example, Kuniaki Koyama, et al., "A Stacked Capacitor With $(Ba_{1-x}Sr_x)TiO_3$ For 256M DRAM" in *IDEM*(International Electron Devices Meeting) *Technical Digest*, December 1991, pp. 32.1.1–32.1.4, and U.S. Pat. No. 5,122,923 issued to Shogo Matsubara et al. Both these references use the conventional process of depositing BST in integrated circuits, i.e. sputtering. Sputtering is inherently hard to control. While useful in conventional silicon technology, when used in combination with capacitors that use metal oxides as the dielectric, sputtering results in capacitors that have relatively high leakage current, fatigue significantly, and generally have undesirable electrical properties.

Liquid precursors have also been used for making certain metal oxides. See G. M. Vest and S. Singaram, "Synthesis of "Metallo-organic Compounds For MOD Powders and Films", *Materials Research Society Symposium Proceedings*, Vol. 60, 1986, pp. 35–42, Robert W. Vest and Jiejie Xu, "$PbTiO_3$ Thin Films From Metalloorganic Precursors", *IEEE Transactions On Ultrasonics, Ferroelectrics, and Frequency Control*, Vol 35, No. 6, Nov. 1988, pp. 711–717, "Metalorganic Deposition (MOD): A Nonvacuum, Spin-on, Liquid-Based, Thin Film Method", *Materials Research Society Bulletin.*, October 1989, pp. 48–53, and W. W. Davidson, S. G. Shyu, R. D. Roseman, and R. C. Buchanan, "Metal Oxide Films From Carboxylate Precursors", in *Materials Research Society Symposium Proceedings*, Vol. 121, pp. 797–802, 1988. In this disclosure the term "liquid" does not include gels produced in sol-gel processes such as those disclosed in B. M. Melnick, J. D. Cuchiaro, L. D. McMillan, C. A. Paz De Araujo, and J. F. Scott, "Process Optimization and Characterization of Device Worthy Sol-Gel Based PZT For Ferroelectric Memories," in *Ferroelectric*, Vol. 109, pp. 1–23, 1990, and U.S. Pat. No. 4,946,710 issued to William D. Miller, Leo N. Chapin, and Joseph T. Evans.

In the prior art processes employing liquid precursors, a metal-organic compound is dissolved in a suitable liquid solvent which is applied to a substrate, usually by spin-coating. In the Vest references (the first three in the group just cited) and the Davidson reference, the preferred solvent is xylenes although toluene and benzene are also mentioned. However, the metal-organic compound heated to high temperatures and dried to a solid or semisolid before dissolving it in xylene. While some prior art references speculate that the liquid deposition process might have advantages over sputtering or the sol-gel process in the fabrication of electronic devices, the parameters of the actual devices made by the authors and discussed in the references were not in the range in which useful electronic devices could be produced. For example, in the Vest and Singram reference, the grain size reported was 2000 Å minimum, which is as large or larger than the film thickness typically used for capacitor dielectrics in integrated circuits, and in the Vest and Xu reference, the hysteresis loops obtained were not suitable for useful electronic devices. Thus, up to the time of the present invention, the liquid precursor processes have not been useful to make commercial electronic devices.

3. Solution to the problem

The present invention solves the above problems by providing a liquid precursor solution comprising an oxygenated metallic moiety dissolved in a first solvent, then, prior to applying the precursor to an integrated circuit substrate, the first solvent is exchanged for a second solvent to produce a final liquid precursor solution. The precursor remains a liquid throughout the process. The first solvent is preferably a solvent in which the oxygenated metallic moiety dissolves readily and preferably results in a precursor which remains essentially unchanged during storage. The second solvent is preferably one that is adheres well to the substrate, i.e. wets the substrate well, and which disassociates from the metal oxide in subsequent heating steps in a manner that leaves a smooth, dense uniform coating without cracks and other imperfections.

Preferably the second solvent has a higher boiling point than the first solvent. This not only facilitates solvent exchange, but results in slower dissociation which results in less cracking and imperfections. However, it is possible for the second solvent to be a mixture of solvents, including a solvent or solvents that have a lower boiling point than the first solvent, provided one of the solvents has a higher boiling point.

In an exemplary embodiment, capacitors made with a dielectric material comprising barium strontium titanate (BST) thin films having the formula $Ba_{1-x}Sr_xTiO_3$, where x is 0.03, were found to have a dielectric constant of nearly 500 and a leakage current of about $10^{-9}$ amps/cm$^2$ when made by the process of the invention. The above dielectric constant is about twice as large and the leakage current is about ten times as small as the best respective properties reported in the prior art for BST thin films.

The invention provides a method of fabricating a metal oxide thin film for use in fabricating an integrated circuit comprising the steps of: providing an integrated circuit substrate; providing an initial liquid precursor comprising a metallic compound in a first solvent; adding a second solvent to the initial liquid precursor to form an intermediate precursor; heating the liquid precursor to distill off the first solvent and form a final liquid precursor that is capable of forming a metal oxide thin film having better electrical properties than the thin films formed by the initial precursor; applying the final liquid precursor to the substrate; and treating the final precursor on the substrate to form a thin film of the metal oxide. Preferably, the first solvent is a liquid that reacts with the metal and the second solvent comprises a liquid that does not react with the metal. Preferably, the final precursor liquid wets the substrate better than the first precursor liquid. Preferably, the metallic compound comprises a compound selected from the group consisting of metal carboxylates, metal alkoxides, and metal alkoxycarboxylates, and the metal oxide comprises one or more compounds selected from the group consisting of barium strontium titanate, strontium titanate, barium titanate, bismuth titanate, strontium bismuth tantalate, strontium bismuth niobate, strontium bismuth tantalum niobate, barium bismuth tantalate, lead bismuth tantalate, and barium bismuth niobate. Preferably, the second solvent comprises a liquid selected from the group consisting of xylenes and n-butyl acetate. Preferably, the first solvent comprises 2-methoxyethanol and the second solvent comprises xylene. Preferably, the step of applying comprises spin-coating.

In another aspect, the invention provides a method of fabricating a metal oxide thin film for use in an integrated circuit comprising the steps of: providing an integrated circuit substrate; providing an initial liquid precursor comprising a metallic compound dissolved in a first solvent and a second solvent; heating the initial liquid precursor to distill off the first solvent and form a final liquid precursor that is capable of forming a metal oxide thin film having better electrical properties than the thin films formed by a precursor including the first solvent; applying the final liquid precursor to the substrate; and treating the final precursor on the substrate to form a thin film of the metal oxide.

In a further aspect, the invention provides a method of fabricating a metal oxide thin film for use in an integrated circuit, the method comprising the steps of: providing an integrated circuit substrate and a liquid precursor comprising a metallic compound dissolved in an alcohol and a second solvent; heating the liquid precursor to distill off the alcohol and form a final liquid precursor comprising the metallic compound dissolved in the second solvent; applying the precursor to the substrate; and treating the precursor on the substrate to evaporate the second solvent and form a thin film of the metal oxide. Preferably, the step of providing a liquid precursor comprises the steps of: reacting a metal or a metallic compound with the first solvent to form an initial liquid precursor comprising a reactant dissolved in the first solvent; and adding the second solvent to the initial liquid precursor. Preferably, the alcohol is selected from 2-methoxyethanol and isopropanol. Preferably, the alcohol is 2-methoxyethanol and the second solvent comprises xylene, n-butyl acetate, or a combination thereof. Preferably, the step of applying comprises spin-coating and the step of treating comprises drying and annealing the final precursor on the substrate. Preferably, the metallic compound comprises a compound selected from the group consisting of metal carboxylates, metal alkoxides, and metal alkoxycarboxylates. Preferably, the metal oxide comprises one or more compounds selected from the group consisting of barium strontium titanate, strontium titanate, barium titanate, bismuth titanate, strontium bismuth tantalate, strontium bismuth niobate, strontium bismuth tantalum niobate, barium bismuth tantalate, lead bismuth tantalate, and barium bismuth niobate.

In another aspect the invention provides a method of fabricating a metal oxide thin film for use in an integrated circuit comprising the steps of: providing an integrated circuit substrate; providing an initial liquid precursor comprising a metallic compound in a first solvent; storing said initial liquid precursor longer than one week; adding a second solvent to the liquid precursor; heating the liquid precursor to distill off the first solvent and form a final precursor that is capable of forming a metal oxide thin film having better electrical properties than the thin films formed by the initial precursor; applying the final precursor to the substrate; and treating the final precursor on the substrate to form a thin film of the metal oxide.

In another aspect the invention provides a method of making a final liquid precursor for use in manufacturing metal oxide thin films for use in integrated circuits, the method comprising the steps of: providing an initial liquid precursor comprising an oxygenated metallic moiety dissolved in a first solvent; and performing a solvent exchange step on the initial liquid precursor to form the final precursor. Preferably, the solvent exchange step comprises adding a second solvent to the liquid initial precursor and distilling off the first solvent. Preferably, the first solvent comprises a liquid selected from the group comprising carboxylic acids and alcohols and the second solvent comprises a solvent selected from the group consisting of xylenes and n-butyl acetate. Preferably, the oxygenated metallic moiety comprises a compound selected from the group consisting of metal carboxylates, metal alkoxides, and metal alkoxycarboxylates. Preferably, the metal oxide comprises one or more compounds selected from the group consisting of barium strontium titanate, strontium titanate, barium titanate, bismuth titanate, strontium bismuth tantalate, strontium bismuth niobate, strontium bismuth tantalum niobate, barium bismuth tantalate, lead bismuth tantalate, and barium bismuth niobate.

In still another aspect, the invention provides a method of making a final liquid precursor for use in manufacturing metal oxide thin films for use in integrated circuits, the method comprising the steps of: providing an initial liquid precursor comprising an oxygenated metallic moiety dissolved in a solvent; and performing a xylene exchange step on the initial liquid precursor to form the final precursor.

The invention also provides a method of fabricating a metal oxide thin film containing bismuth for use in an integrated circuit, the method comprising the steps of: providing an integrated circuit substrate; providing a metal compound solution comprising an oxygenated metallic moiety dissolved in a solvent; providing a bismuth solution comprising a bismuth compound in a solvent; and adding the bismuth solution to the metal compound solution to form the liquid precursor and applying the liquid precursor to the substrate, all the while maintaining the bismuth solution and the liquid precursor at a temperature of 30° C. or less; and treating the final precursor on the substrate to form a thin film of the metal oxide. Preferably the metal oxide is a compound selected from the group consisting of strontium bismuth tantalate, strontium bismuth niobate, and strontium bismuth tantalum niobate.

In another aspect the invention provides a method of making a liquid precursor for use in manufacturing metal oxide thin films containing bismuth for use in integrated circuits, the method comprising the steps of: providing a metal compound solution at a temperature of greater than 30° C., the metal compound solution comprising an oxygenated metallic moiety dissolved in a solvent; cooling the metal compound solution to 30° C. or below; providing a bismuth solution comprising a bismuth compound in a solvent; and adding the bismuth solution to the cooled metal compound solution to form the precursor. Preferably, the metallic moiety includes a metal selected from the group consisting of strontium, tantalum, and niobium.

The precursors of the invention not only form thin films with better electrical properties, but are less sensitive to handling and easier to use, and thus lend themselves more readily to mass production of integrated circuits. Numerous other features, objects and advantages of the invention will become apparent from the following description when read in conjunction with the accompanying drawings.

DESCRIPTION OF THE PREFERRED EMBODIMENT

1. Overview

Figure 1:
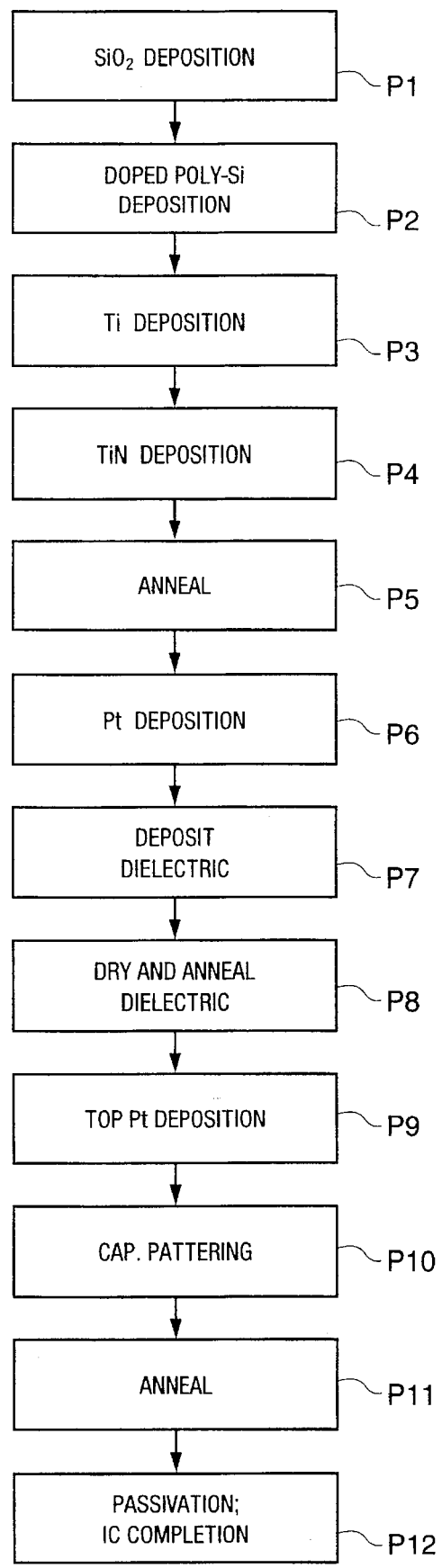
FIG. 1 is a flow chart of an process in which capacitor electronic devices were fabricated utilizing the process of the invention to form a BST dielectric material.

FIG. 1 shows a flow chart of a process according to the invention that was used to fabricate integrated circuit capacitors including metal oxide thin films of much higher quality and better electrical properties than prior art processes can produce. The present invention involves steps P7 and P8, in which steps the metal oxide thin films were fabricated.

Figure 2:
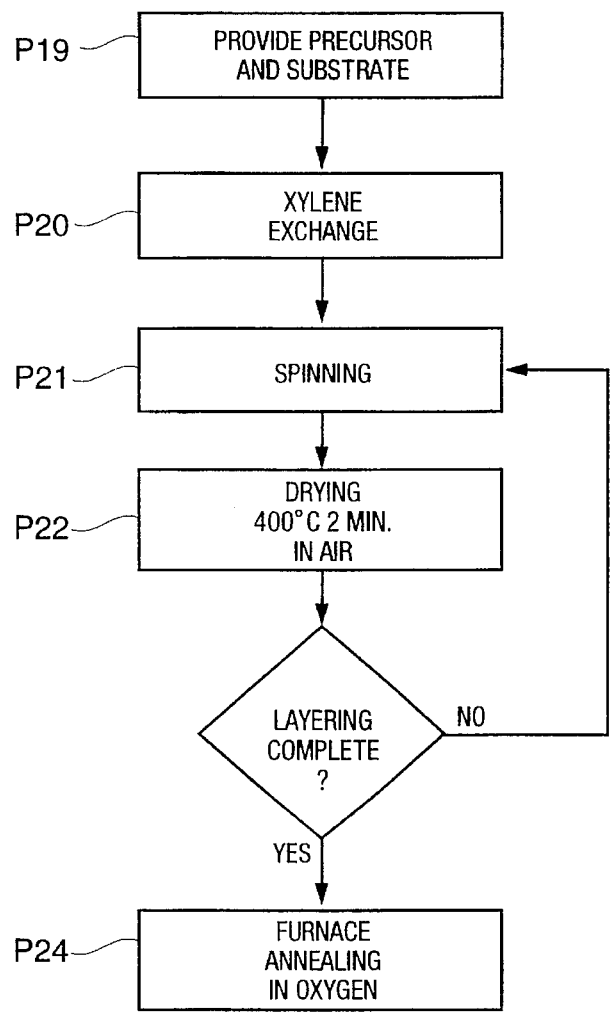
FIG. 2 is a flow chart showing the preferred process for formation of BST.

The flow chart of FIG. 2 shows the details of one embodiment of steps P7 and P8. In step P19 an initial precursor solution and a substrate were provided. As will be discussed in more detail below, the precursor solution included titanium alkoxide and strontium and barium alkoxycarboxylates dissolved in 2-methoxyethanol solvent, and the substrate was a silicon wafer having layers of silicon oxide, doped polysilicon, and a multilayered electrode formed on it. In step P20 a xylene exchange was performed by adding xylene and distilling away the 2-methoxyethanol, which has a lower boiling point than xylene. In the examples of this disclosure, the xylene used was a commercially available xylene solution which includes three different fractionations of xylene. Thus the liquid is sometimes referred to as "xylenes". However, it should be understood that a single fractionation is also contemplated by the terms "xylene" or "xylenes".

Figure 8:
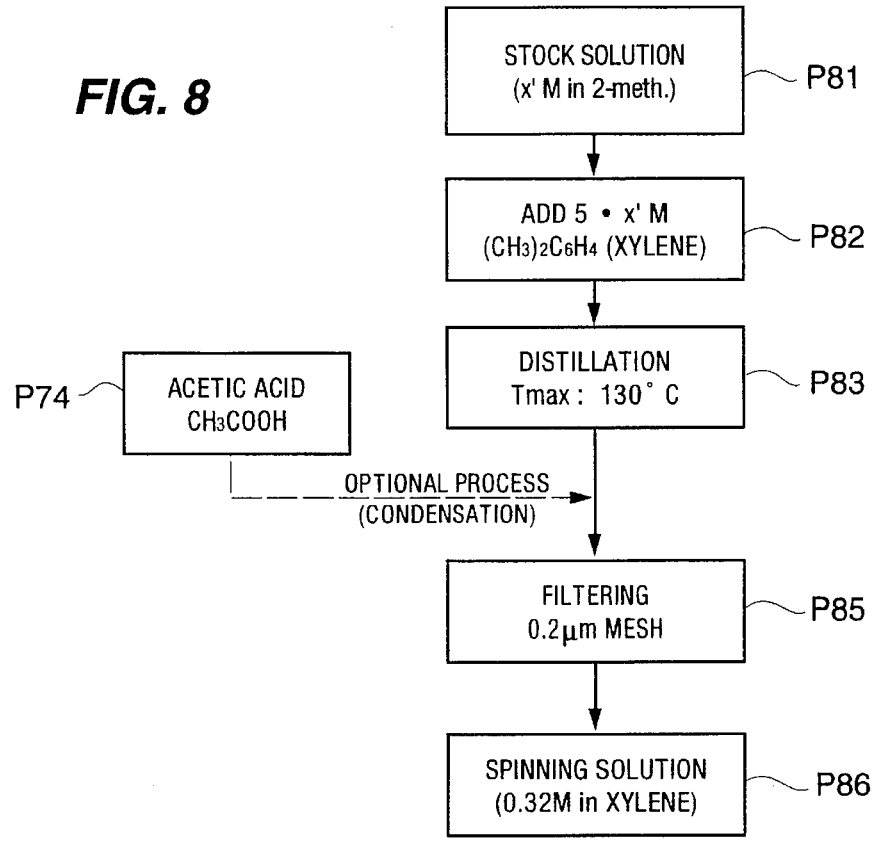
FIG. 8 is a flow chart showing in detail an exemplary solvent exchange process according to the invention.

The details of the xylene exchange of step P20 are shown in FIG. 8 and will be discussed below. The resulting final precursor solution was then applied to the substrate by spin-coating in step P21 and dried in step P22 to form a thin layer of BST. Then another layer of BST was formed by repeating steps P20 through P22, and finally the substrate and BST layers were annealed in step P24 to form the BST dielectric thin film.

Figure 4:
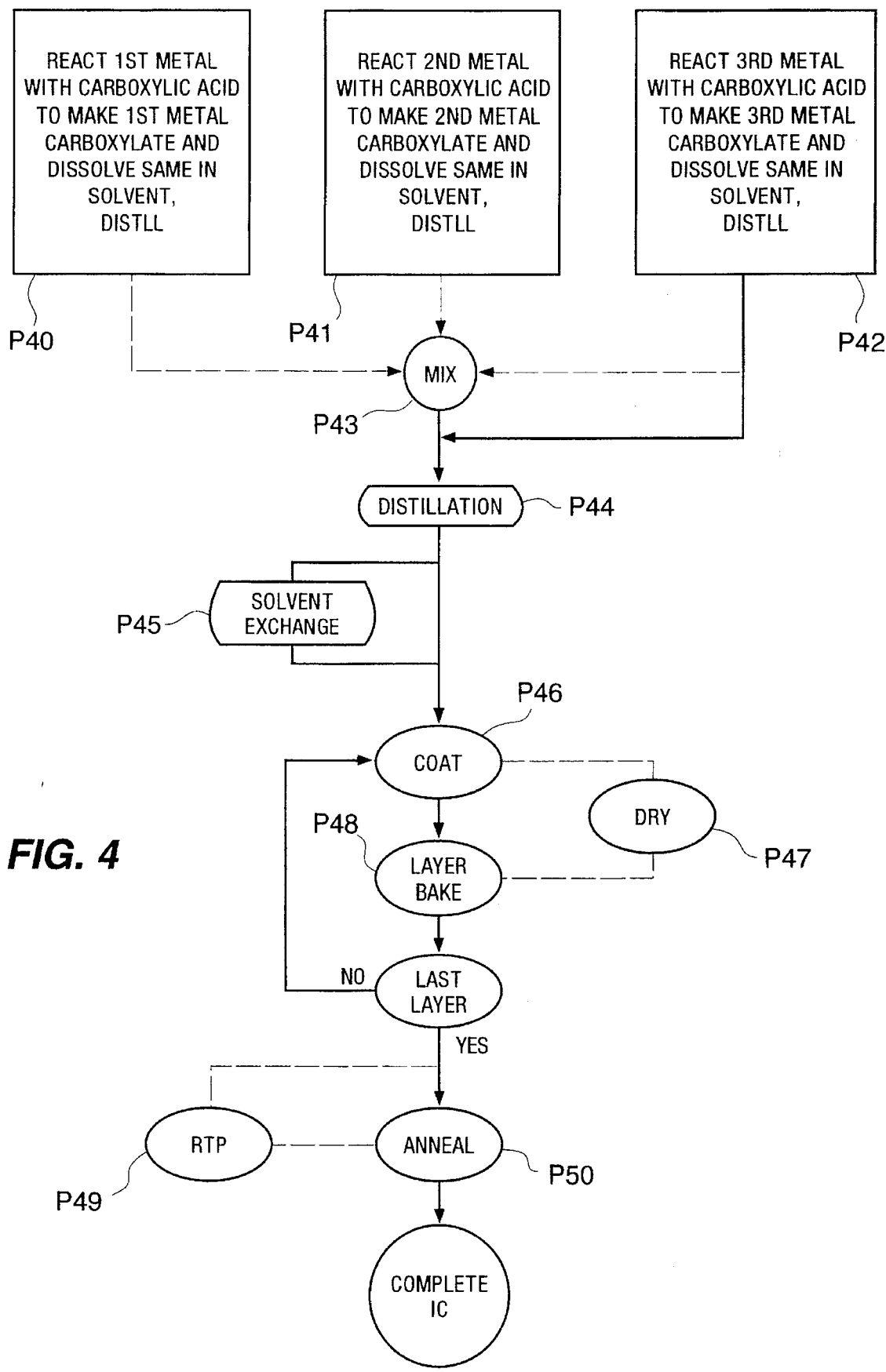
FIG. 4 is a flow chart of a generalized process according to the invention for making a metal oxide.
Figure 5:
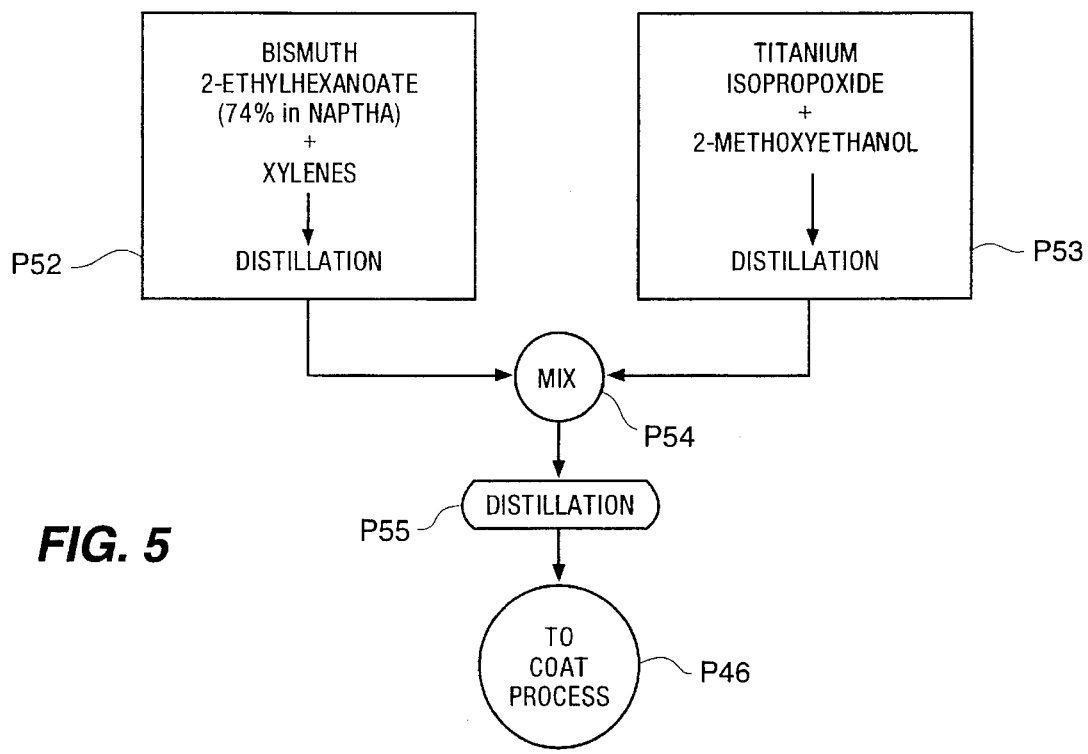
FIG. 5 is a flow chart showing a portion of a process according to the invention used for fabricating a bismuth titanate metal oxide.
Figure 6:
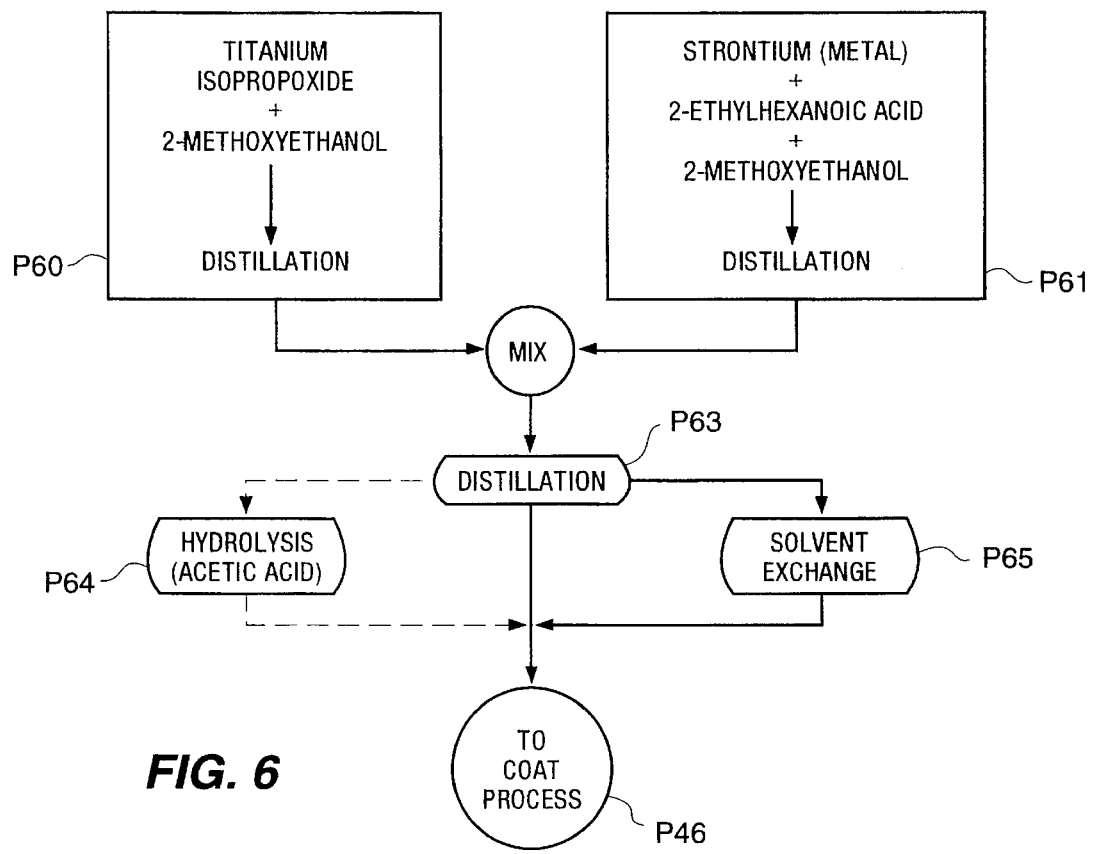
FIG. 6 is flow chart showing a portion of a process according to the invention used for fabricating a strontium titanate metal oxide.

FIGS. 4 and 6 show other examples of processes according to the invention which include a solvent exchange similar to that discussed in the above paragraph. FIG. 5 shows an example of another embodiment of a solvent exchange. In this embodiment, in step P52, the second solvent, xylene, is added to a first portion of the initial precursor which includes the first solvent naphtha, and is then mixed, in step P54, with a second portion of the initial precursor which includes the first solvent 2-methoxyethanol, and then the naphtha and 2-methoxyethanol are distilled away in step P55.

Figure 3:
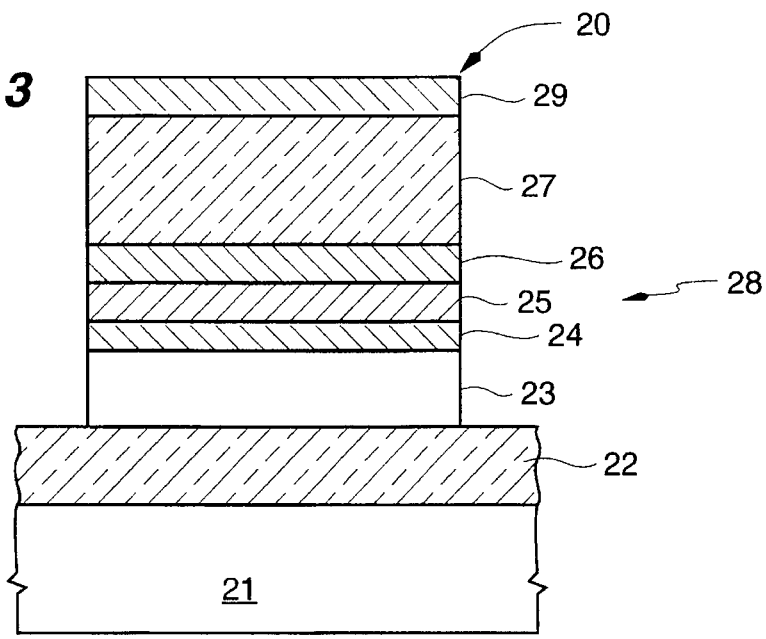
FIG. 3 is a cross-sectional view of an integrated circuit capacitor fabricated using the processes of the invention.
Figure 9:
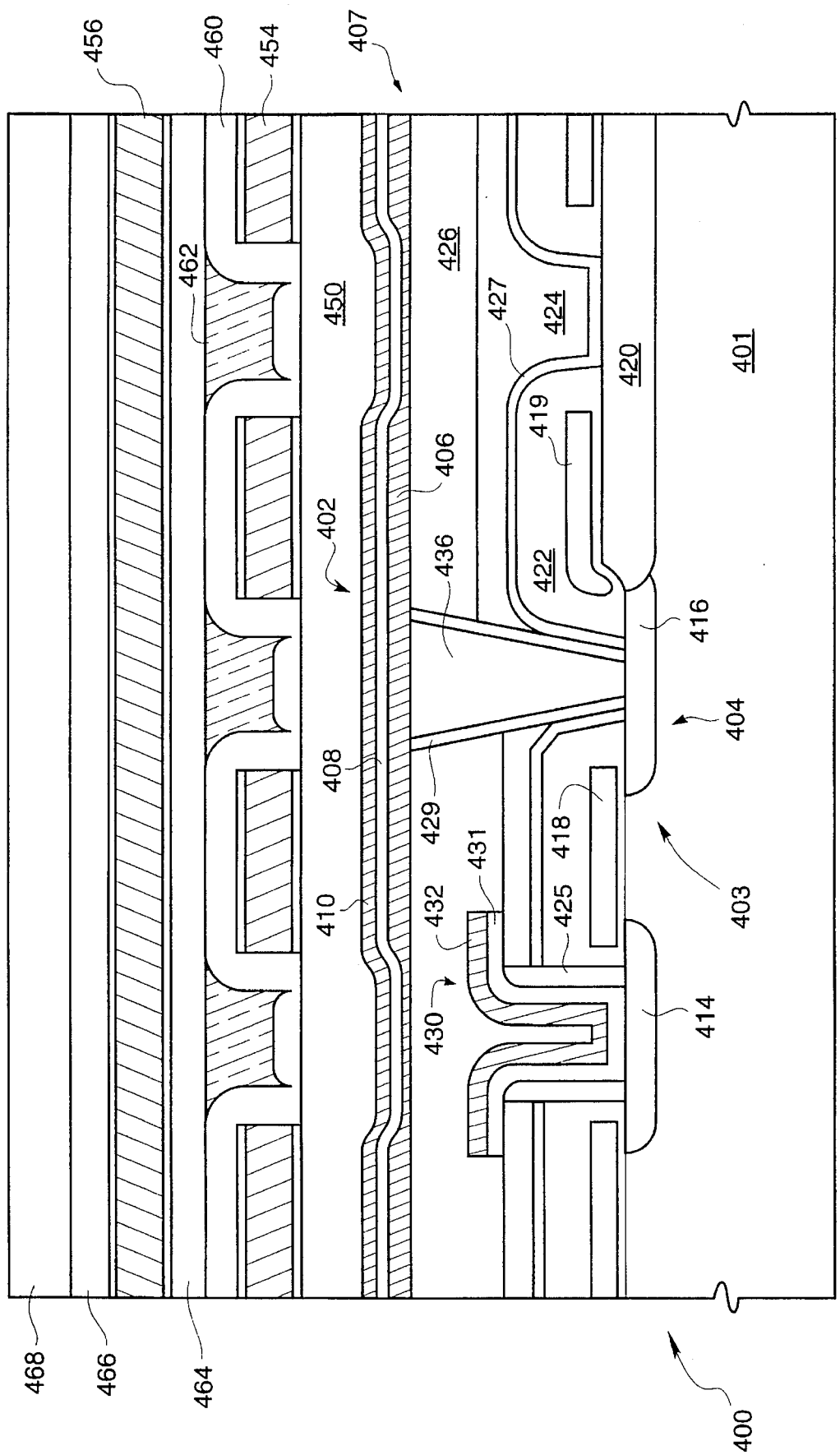
FIG. 9 is a cross-sectional view of a portion of a MOS integrated circuit fabricated using the process of the invention.

FIGS. 3 and 9 show cross-sectional views of electronic devices fabricated using the processes of the invention.

2. Detailed Description of the Exemplary Embodiments

Before turning to the detailed description of the invention, the devices of FIGS. 3 and 9 will be described so that the inventive processes can be more easily understood. FIG. 3 shows a cross-sectional view of an integrated circuit capacitor 20 according to the invention. Capacitor 20 is formed on a substrate 28 comprising a silicon base substrate 21, a silicon dioxide layer 22, a doped polysilicon layer 23, a titanium layer 24, and a titanium nitride layer 25. In this disclosure the term "substrate" is used both in a general sense in which it means any underlying layer or layers and a particular sense in which it means the base wafer, such as 21 in FIG. 3, on which the integrated circuit is made. In the general sense, any layer or group of layers in FIGS. 3 and 9, except the top most layer, forms a substrate for the subsequent layer or layers. Capacitor 20 comprises a platinum first electrode 26, sometimes referred to as the "bottom electrode 26", a layer 27 of dielectric material, and a second electrode 29, sometimes referred to as the "top electrode".

A cross-sectional view of a portion of a MOS DRAM memory 400 that has been fabricated using the process of the invention is shown in FIG. 9. Memory 400 was formed on a silicon wafer 401 and included a transistor 404 and a flat, planar capacitor 402 which together formed a memory cell 403. Doped areas 414 and 416 formed the source/drains of transistor 404, while the gate 418 of the transistor 404 and other word line portions, such as 419, were formed of polysilicon. Field oxide regions 420 and gate oxide regions 422 insulated the gate/word line polysilicon 418. A polycide bit line 430 comprising a polysilicon layer 431 and a metal silicide layer 432 connected the source/drain 414 to external circuits. A polysilicon plug 436 connected the source/drain 416 to the first electrode 406 of capacitor 402. Silicon nitride layers 427 and 429, oxide layers 424 and 425, and BPSG (borophosphosilicate glass) layer 426 further insulated the circuit elements. The capacitor 402 included the first or bottom electrode 406, the second or top electrode 410, and dielectric 408. All the details of the capacitor structure are not shown in FIG. 9 because of the scale of the figure. However, the bottom electrode 406 was a multilayered structure of Ti/TiN/Pt as shown in FIG. 3, though it could also be TiSix/TiN/Pt, a four-layered structure such as TiSix/Ti/TiN/Pt, TiSix/Ta/TiN/Pt, or many other structures which include an adhesion layer 24 and barrier layer 25. Dielectric layer 408 was $Ba_{0.7}Sr_{0.3}TiO_3$, fabricated by the processes of the invention, as described below. Second or top electrode 410 was formed of platinum, but may also be TiN, Ti or may be multilayered, like the bottom electrode 406. BPSG layer 450 separated the capacitor 402 and the metallization layers 454 and 456 above it. First metallization layer 454 and second metallization layer 456 were multilayered, with layer 454 preferably formed, from bottom to top, of Ti/TiN/Al/TiN and layer 456 formed of TiN/Al/TiN, though other structures are also possible. In FIG. 9, both layers are shown as sandwiches rather than show the details since they are not directly related to the invention herein. Plasma deposited $SiO_2$ layers 460 and 464, SOG (spin-on glass) layer 462, and PSG (phosphosilicate glass) layer 466 insulated the metallization layers 454 and 456. A passivation layer of plasma deposited silicon nitride ($Si_3N_4$) completed the memory 400.

It should be understood that the FIG. 3 depicting an integrated circuit capacitor and FIG. 9 depicting an integrated circuit MOS DRAM memory cell are not meant to be actual plan or cross-sectional views of any particular portion of an actual capacitor or MOS device, but are merely idealized representations which are employed to more clearly and fully depict the structure and process of the invention than would otherwise be possible. Further, while the capacitors 20 (FIG. 3) and 402 (FIG. 9), according to the invention were formed on a base substrates 21 and 401, respectively, made of silicon, other base substrates, such as gallium arsenide, indium antimonide, magnesium oxide, strontium titanate, sapphire, quartz and combinations of the forgoing as well as other materials may be used. While the insulating layers 22, 420 and 422 etc. were made of silicon dioxide and the layer 427 was made of silicon nitrate, combinations of these materials and other insulating materials may also be used. The conductive layers 23 and 436 were made of polysilicon, but may also be made of metal silicide, combinations of the foregoing, and other conductors. The adhesion or contact layer, such as 24, was made of titanium, but may also be tantalum, titanium, tantalum silicide, combinations of the forgoing, and other conductors. The barrier layers, such as 25, which prevents migration of materials between the underlying layers, such as 21, 22, and 23, and the electronic components, such as capacitor 20, were titanium nitride (TN), but may also be tantalum nitride, combinations of the foregoing, and other materials. The capacitor electrodes, 26, 29, etc. were formed of platinum, although palladium, nickel, combinations of the foregoing, and other conductors may be used. The dielectric material 27, 408, was preferably BST, but may also be a metal oxide of the form $ABO_3$, $AA'BB'O_3$, $ABB'O_3$, $AA'BO_3$, etc., a layered superlattice material as described in U.S. patent application Ser. No. 08/154,927 which is incorporated herein by reference, combinations of the foregoing, and other dielectrics. The dielectric may be a high dielectric constant material, such as BST, in which case the DRAM 400 is a volatile memory. Or the dielectric may be a switching ferroelectric, in which case the DRAM 400 is a non-volatile memory. Several examples other than BST, including both high dielectric constant materials and ferroelectric materials, are given below. All of the samples showed excellent properties well beyond what was possible in the prior art. As a result of the excellent properties of the capacitors 20 according to the invention, simple planar capacitors, such as capacitor 402, may be utilized in ULSI circuits, such as memory 400. This greatly simplifies the fabrication process, increases yields, and decreases costs.

A flow chart of the process in which several samples of an integrated circuit capacitor 20 of FIG. 3 were fabricated is shown in FIG. 1. In step P1 a silicon dioxide layer 22 was formed on silicon wafer 21, preferably by thermal oxidation in an oxygen furnace. Silicon dioxide layer 22 was preferably between about 500 Å to 8,000 Å thick. Then, preferably, in step P2 a layer of doped polysilicon about 5000 Å thick was deposited. The doping was P-type. Then followed step P3 in which a layer 24 of titanium (Ti) of about 500 Å to 600 Å thick was deposited, preferably by sputtering. In this and the other sputtering steps below, an ANELVA ILC-1015 DC magnetron 6" system was used. The sputtering power for the Ti deposition step P3 was about 1 kilowatt. Then, in step P4, a layer 25 of titanium nitride (TiN) was deposited, preferably at about 5 kilowatts of power. The thickness of this layer in various samples varied from about 900 Å to about 3000 Å. In step P5 the layers deposited up to this point were annealed, preferably in a nitrogen atmosphere at a temperature from 650° C. to 850° C. for about 30 minutes. To distinguish from other anneal steps, we refer to this anneal step as the "first anneal" or "barrier anneal". Preferably a temperature of 800° C. was used. Then in step P6 a layer 26 of platinum was deposited to form the first electrode 26. In the preferred embodiment, this layer 26 was between about 1800 Å and 2200 Å thick and was formed by DC magnetron sputtering. Then, in step P7, the dielectric 27 was deposited. Preferably the dielectric was BST and the deposition was by spinning an alkoxycarboxylate precursor. However, the deposition may also be mist deposition at ambient temperature in a vacuum as described in U.S. patent application Ser. No. 07/992,380, and other materials, such a layered superlattice ferroelectrics, may also be used. Examples of layered superlattice ferroelectric thin films made by the process of the invention are discussed below. In the embodiment of spin deposition, preferably the spinning was at between about 1500 RPM and 2000 RPM for between about 30 and 40 seconds, though this varied depending on the viscosity of the precursor and the desired thickness of the film 27. In step P8 the dielectric was dried and annealed. This anneal shall be referred to herein as the "second anneal" or the "dielectric anneal". In the case of BST, the drying was done at about 400° C. for from 2–5 minutes. In the case of a layered superlattice material, such as strontium bismuth tantalate, the drying was in two steps, one at about 150° C. for about 2 minutes and a second at about 270° C. for about 4 minutes, or, alternatively, in one step at about 250° C. for three minutes. The drying was done in air or in nitrogen, preferably at low humidity, of about 40% or less. The annealing was preferably in oxygen at from about 700° C. to about 850° C. for from 1 hour to 2 hours. For BST, the annealing was preferably at 750° C. to 800° C. for 80 minutes, while for strontium bismuth tantalate, the annealing was preferably at about 800° C. for about 70 minutes or, alternatively, at about 750° C. for two hours. In some cases an RTP anneal may precede the furnace anneal. When an RTP anneal is done, it is preferably at from about 100° C./sec to 125° C./see ramp rate and a maximum temperature of 600° C. to 750° C. for about 30 seconds. The RTP is preferably performed in oxygen.

A more detailed example of the preferred process for making a BST layer 27, 408 is shown in FIG. 2. In step 19 an initial precursor and substrate were provided as discussed above. In the preferred embodiment, an xylene exchange step P20 was performed just prior to spinning. That is, the original precursor solution prepared and stored was a methoxyethanol-based solution. Just prior to use, the methoxyethanol of the original precursor solution was exchanged for xylene by adding xylene and heating to evaporate out the methoxyethanol which has a lower boiling temperature than the xylene.

A detailed example of the preferred xylene exchange step P20 is shown in FIG. 8. In step P81 the initial precursor stock solution having a molarity of x'M in the first solvent, 2-methoxyethanol, is provided. In step P82 the initial precursor is mixed in a 5:1 ratio with xylene; that is, an amount of xylenes equal to 5 times the amount of the initial precursor is added. The resulting solution is distilled in step P83 at a maximum temperature of 130° C. At this point, a few drops of acetic acid may be added in step P84, though this is optional and is usually is not done. The resulting solution may be filtered through a 0.2 micrometer filter in step P85, though this may be skipped. The resulting final solution is a 0.32M solution in xylene. Thus the 2-methoxyethanol has been replaced with xylene and the molarity adjusted.

The final xylene-based precursor solution was spun on the substrate 28 in step P21 at between about 1500 RPM and 2000 RPM for between about 30 and 40 seconds, then the precursor was dried in air at between 375° C. and 425° C., preferably at about 400° C., for about 2 minutes. The drying temperature was significantly higher than in the prior art. The drying may also be done in nitrogen. The spinning step P21 was repeated. Preferably it was repeated once for a total of 2 layers, though more layers could be used. After the layering was complete, the multiple layers of dried precursor on the substrate 28 are annealed in step P24 to form the BST dielectric layer 27, 408.

A generalization of the preferred process for fabricating a metal oxide in which there are three metallic elements, such as a layered superlattice material having three metallic elements, is shown in FIG. 4. In steps 40 through 44 an initial liquid precursor including an oxygenated metallic moiety is formed. Preferably the oxygenated metallic moiety is a metal-alkoxycarboxylate as described in U.S. patent application Ser. No. 08/132,744 filed Oct. 6, 1993, which is hereby incorporated by reference. The oxygenated metallic moiety may also comprise a metal-alkoxide, a metal-carboxylate or other metal compound including metal-oxide bonds. In each of steps P40 through P42 a metal compound is reacted with a carboxylic acid to form a metal carboxylate, which is dissolved in a first solvent. The preferred carboxylic acid is one having a medium-length ligand, such as 2-ethylhexanoic acid, although others may be used. Preferably the first solvent's boiling point should be within the range 110° C.–150° C. The preferred solvents are alcohols, such as 2-methoxyethanol, aromatic hydrocarbons, such as the xylenes, and esters, such as n-butyl acetate, though any of the solvents in Table A, or combinations thereof, may be used.

TABLE A

| Solvent | Boiling Point |
| --- | --- |
| 2-methoxyethanol | (bp = 124° C.) |
| xylenes | (bp = 138° C.–143° C.) |
| n-Butyl acetate | (bp = 126.5° C.) |
| N, N-dimethylformamide | (bp = 153° C.) |
| 2-Methoxyethyl acetate | (bp = 145° C.) |
| Methyl isobutyl ketone | (bp = 116° C.) |
| Methyl isoamyl ketone | (bp = 144° C.) |
| Isoamyl alcohol | (bp = 132° C.) |
| Cyclohexanone | (bp = 156° C.) |
| 2-Ethoxyethanol | (bp = 135° C.) |
| 2-Methoxyethyl ether | (bp = 162° C.) |
| Methyl butyl ketone | (bp = 127° C.) |
| Hexyl alcohol | (bp = 157° C.) |
| 2-Pentanol | (bp = 119° C.) |
| Ethyl butyrate | (bp = 121° C.) |
| Nitroethane | (bp = 114° C.) |
| Pyrimidine | (bp = 123° C.) |
| 1, 3, 5 Trioxane | (bp = 115° C.) |
| Isobutyl isobutyrate | (bp = 147° C.) |
| Isobutyl propionate | (bp = 137° C.) |
| Propyl propionate | (bp = 122° C.) |
| Ethyl Lactate | (bp = 154° C.) |
| n-Butanol | (bp = 117° C.) |
| n-Pentanol | (bp = 138° C.) |
| 3-Pentanol | (bp = 116° C.) |
| ethylbenzene | (bp = 136° C.) |

The amounts of the metals used are usually proportioned so that an equivalent weight of each metal equal to the molecular weight of the metal in the stoichiometric formula for the desired metal oxide is present in the precursor. An exception is lead. Generally an excess of lead of between 1% and 100%, preferably between 3% and 10%, of the equivalent stoichiometric amount is included because lead oxide has a higher vapor pressure than the other metals and a significant amount of lead evaporates as lead oxide during baking and annealing. Similarly, excess amounts of other materials, such as bismuth, thallium, and antimony, that evaporate or otherwise are lost in the process may be used.

The steps P40, P41, and P42 are preferably performed by mixing the metal or other metal compound, such as a metal alkoxide, with the carboxylic acid and the solvent and stirring. Low heat of between about 70° C. and 90° C. may be added to assist the reaction and dissolving, but this is generally not necessary. The solid arrows indicate that generally, the chemist will perform all the steps P1, P2 and P3 in the same container; that is the first metal or metal compound, the first measure of carboxylic acid, and a solvent are placed in a container, the metal or metal compound and carboxylic acid are reacted, and the reactant dissolved, the second metal or metal compound is then placed in the same container and additional carboxylic acid and solvent are added and stirred to react the second metal or metal alkoxide and dissolve the reactant, then the third metal or metal compound, third carboxylic acid, and solvent are added, the metal or metal compound is reacted, and the reactant dissolved. In this process the most reactive metal or metal compound is preferably added first, the second most reactive metal or metal compound added second, etc. and the bismuth metal compound added last. It also may be desirable to perform the distillation step after each or some of the metal and/or metal compounds are reacted and dissolved, except that distillation is generally kept to t minimum after the bismuth is added. Alternatively, each metal and/or metal compound may be combined with a carboxylic acid and solvent, reacted, and dissolved in a separate container, the result distilled if desirable, and then the three separate solutions mixed in step P43. Variations and combinations of preparing the individual metal precursors separately or in the same container with or without distillation(s) may be used depending on the solvents used and the form in which metal element is readily available. In addition it should be understood that if the desired metal oxide includes only two metallic elements, then only two metals or metal compounds will be reacted and dissolved, and if the desired metal oxide includes four or more metallic elements, then four or more metals or metal compounds will be reacted and dissolved. Further, it is understood that any of the steps P40, P41, and P42 may be replaced by using a preprepared metal carboxylate.

When the solution of reacted and dissolved metal carboxylates has been prepared, the mixed precursor solution is then distilled in step P44 by heating and stirring the solution to reduce the solution to the desired volume and viscosity, which may depend on whether the solution is to be stored or used immediately, and/or to remove certain liquids. Generally, if it is desirable to remove certain liquids, the solution is heated to a temperature above the boiling point of the liquids to be removed and below the boiling point of the liquids that are desired to be retained. The solution is distilled until all the solvents that are desired to be removed have evaporated and a desired volume and viscosity are reached. It may be necessary to add the desired first solvent several times in the distilling process to remove all undesired solvents and obtain the desired volume and viscosity. The resulting solution upon the completion of step P44 is called the "initial liquid precursor" herein to distinguish it from the "final liquid precursor" formed by the solvent exchange step. If the initial liquid precursor is to be stored before using, the first solvent is selected so that the initial liquid precursor stores well. That is, so that the initial liquid precursor remains essentially the same for periods of longer than a week. Here, "essentially the same" means that the only changes that take place are ones that have no significant deleterious effect on the ability of the precursor to form electronic quality devices.

Either separately or in combination with the steps P40 through P44, a solvent exchange process P6 is performed. In this step a second solvent is added and the first solvent is distilled away. The second solvent is a solvent that is better at wetting the substrate than the first solvent, has a better viscosity for spin-coating, and generally is inert with respect to the metal oxide compounds in solution and thus can simply evaporate in the subsequent heating processes. This factor helps the second solvent result in a smoother, denser, and more defect free metal oxide thin film. The second solvent is selected such that the final precursor is capable of forming a thin film with better electrical properties than the initial precursor. By "better electrical properties" is meant that, if the dielectric constant is the electrical property of interest, then the dielectric constant is higher for a given leakage current or the leakage current is lower for a given dielectric constant, or both, and, if the electrical properties of interest are the ferroelectric properties, then the polarizability is higher, the switching fatigue is lower, or the hysteresis is more vertical and/or boxier etc.

Although the preferred solvent exchange is a separate step P45, the solvent exchange may also be combined with other steps. For example, the second solvent may be added with the first solvent or solvents in steps P40, P41, and/or P42 and the first solvents distilled away in the distillation step P44. An example of such a process is shown in FIG. 5 and will be discussed in detail below. Or, as suggested in step P45 in FIG. 4, the initial precursor may be stored after the distillation step P44, and the solvent exchange performed just prior to use.

Figure 7:
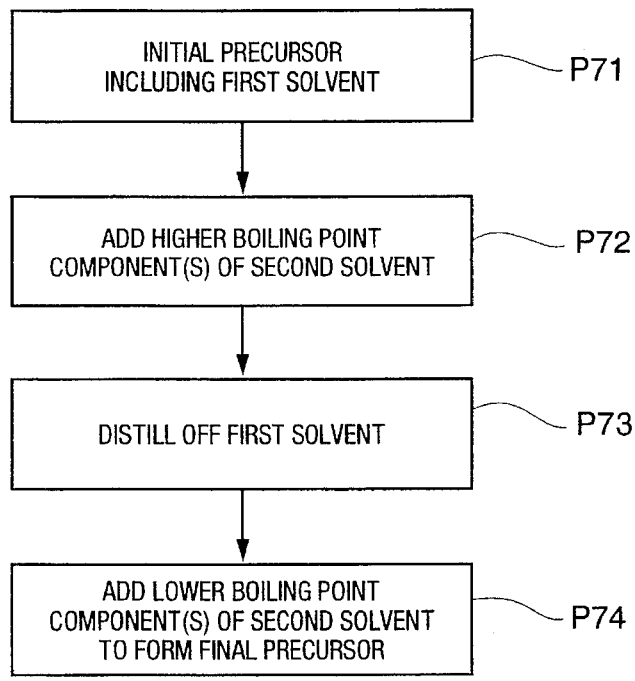
FIG. 7 is a flow chart showing the generalized solvent exchange process according to the invention.

The preferred solvent exchange process is shown in FIG. 7. The initial precursor is provided in step P71 as discussed above and below. The first solvent may be a single solvent, such as 2-methoxyethanol, or may include several components, such as naptha and 2-methoxyethanol. The second solvent may also be a single solvent, such as xylenes, or include several components, such as xylenes and n-butyl acetate. At least one of the components of the second solvent has a higher boiling point than all of the components of the first solvent. In step P72 at least one of the higher boiling point components of the second solvent is added to the solution, though if there are more than one higher boiling point components, they all may be added in this step. In step P73 the solution is heated to distill off the first solvent. Then in step P74 the lower boiling point component or components of the second solvent are added. The result is that the first solvent has been exchanged for the second solvent. An example of the preferred solvent exchange step P45 is shown in FIG. 8; this process was discussed above.

Returning to FIG. 4, in step P46 the final precursor solution is then applied to a substrate, such as the substrate 28 in FIG. 3 or the substrate 407 in FIG. 9. Preferably the coating step P46 may be either a mist deposition at ambient temperature in a vacuum as described in U.S. patent application Ser. No. 07/993,380, which is incorporated herein by reference, or it may be a spin deposition, which is a well-known form of deposition in which the precursor is placed on a wafer and the wafer is spun to evenly distribute the precursor over the wafer. Preferably the wafer is spun at a spin rate of between 750 RPM and 6000 RPM for a period of 5 seconds to a minute, with these parameters depending on the concentration and viscosity of the solution being applied and the desired thickness of the resulting layer. After the coating process, final precursor solution which has been applied to the substrate is treated to form a thin film of the metal oxide. As indicated in the above referenced application Ser. No. 07/993,380, in this context, "treated" means any one or a combination of the following: exposed to vacuum, ultraviolet radiation, electrical poling, drying, heating, and annealing. In the preferred embodiment, the treatment process comprises transferring the partially completed device 20, 400 to a hot plate in which it is baked as indicated at P48. Alternatively, an oven may be used in the baking if it is desirable to control ambients. Preferably, the baking is at a temperature in the range of 200° C. and 500° C. for a time period between 30 seconds and 15 minutes. Optionally, a drying step P47 may be preformed between the coating and bake steps. The drying will generally comprise a heating on a hot plate or in an oven for from about 30 seconds to a few minutes at a lower temperature than the bake step. Preferably, the drying is performed at about 150° C. If the initial coating and bake steps do not result in a layer, 27 in FIG. 3, that is as thick as desired, then the coating P46, optionally the drying step P47, and the baking step P48 are repeated until the desired thickness is obtained. After the last layer is coated and baked, the partially completed device 20, 400 is placed in a diffusion furnace and annealed at step P50. Preferably, the annealing is performed in an oxygen atmosphere at ambient pressure with a flow rate of about 3 liters to 6 liters per minute, and at a temperature of between 600° C. and 850° C. for a time period of between 5 minutes and three hours. The temperature is preferably ramped upward in steps over this period. Optionally, the wafer may be annealed in a rapid thermal process (RTP) step P49 prior to the diffusion furnace anneal step P50. The RTP step utilizes a halogen light source to raise the wafer rapidly to a high temperature in the range from 500° C. to 850° C. for an anneal time of between 15 seconds and 3 minutes. After the annealing P50, the rest of the device 20 or 400 is completed.

For those metals for which the metal carboxylates do not yield a good thin film, a variation of the above process is utilized. In this variation, preferably a metal alkoxide rather than a metal carboxylate precursor is employed. Preferably an alkoxide is chosen that has a medium-length ligand, so that the precursor has a long shelf life and does not produce precipitates. Preferably, the alkoxide is one that is an effective solvent for the fabricating process, and if it is desired, can easily be replaced by xylenes via the addition of xylene and distillation; 2-methoxyethanol is such an ideal alkoxide. When the precursor is a metal alkoxide it is also very important that all the water be distilled out of the solution before it is stored.

An example of the above-described variation of the process of FIG. 4 that was used to produce capacitor devices as shown in FIG. 3 having a bismuth titanate ($Bi_4Ti_3O_{12}$) thin film dielectric 27 is shown in FIG. 5. In particular, this process was used to fabricate the bismuth titanate film as described below in Example 1. In this variation, the initial precursor solution formation portion of the process was the same as that of the process of FIG. 4, except that the reaction and dissolving of the titanium in step P53 did not involve a carboxylic acid. In step P53, titanium isopropoxide is reacted with 2-methoxyethanol to produce titanium 2-methoxyethoxide, isopropanol and water, and the isopropanol and water are distilled off. In step P52 the bismuth metal, bismuth carbonate, or bismuth oxide has already been reacted with a carboxylic acid, i.e. 2-ethylhexanoic acid, to form bismuth 2-ethylhexanoate, a metal carboxylate. Bismuth is readily available commercially in this form. In this variation, as mentioned above, the solvent exchange step takes place in combination with the steps P52, P54 and P55. In the example shown in FIG. 5, the first solvent was 2-methoxyethanol and naphtha and the second solvent was xylene. The xylene is added in step P52 and the first solvents were distilled away in the distillations in step P52 and step P55. The same process, except using tantalum ethoxide instead of the titanium isopropoxide and also including a strontium/2-methoxyethanol reaction in step P52, was used to produce strontium bismuth tantalate in Example 7 below.

Some combination of the processes of FIG. 4 and 5 by using various amounts of 2-ethylhexanoic acid and 2-methoxyethanol in step P53 may also be used to produce bismuth titanate. The 2-methoxyethoxide ligands are more heat sensitive than 2-ethylhexanoate ligands, and the deposition and film shrinkage process may proceed so rapidly that cracking and other defects may occur. Therefore, small amounts of 2-ethylhexanoic acid are added to replace some or all of the 2-methoxyethoxide ligands by 2-ethylhexanoate ligands in the titanium solution just prior to coating. The 2-ethylhexanoate ligands are less thermally sensitive and slow down the deposition and thermal decomposition process, usually producing better results.

FIG. 6 shows another variation of the precursor solution formation process portion of FIG. 4. In the process of FIG. 6, the step P60 is the same as the step P53 of FIG. 5, and the step P61 is the same as one of the steps P40 through P42 in FIG. 4: that is, a metal, strontium, a carboxylic acid, 2-ethylhexanoic acid, and a solvent, 2-methoxyethanol, are combined to produce a metal alkoxycarboxylate, dissolved in a solvent, 2-methoxyethanol. In FIG. 6 an optional step of hydrolysis P64 is shown after the step of distilling P64. The hydrolysis may take place before, during, or after the solvent exchange step P65. The hydrolysis step involves adding water to the solution to react with the metal alkoxide, i.e. titanium 2-methoxyethoxide, to partially polymerize the metal oxides into chains. This is sometimes useful to prevent the film from cracking after deposition. The acetic acid is optional and slows the rate of hydrolysis to prevent solids from forming and precipitating during hydrolysis. The process of FIG. 6 including a solvent exchange step P65 in which the second solvent was xylenes, and not including the hydrolysis step P64, was the process used in preparing the strontium titanate (SrTiO₃) solution as described below in Examples 1 and 3.

It should be understood that the process variations of FIGS. 5 and 6 are not limited to dielectrics 27 having two metals, but that compounds having three or more metals may also be made by these variations by adding additional initial precursors. For example, the variation of FIG. 6 is used to make BST in the Example 2 below by adding a barium initial precursor made in according to step P61. Further it should be understood that the variations of FIGS. 5v and 6 are exemplary of variations of the process of the invention and that many other variations are possible.

Turning back to FIG. 1, after the formation of the dielectric in steps P7 and P8, then followed the second electrode 29 deposition, again preferably platinum with a thickness in the range of about 1800 Å to 2200 Å preferably about 1800 Å thick, and preferably by sputtering. Then the capacitor was patterned in step P10, preferably by ion milling or RIE (reactive ion etching), then was annealed again in step P11, preferably at 750° C. to 800° C. for about 30 minutes in oxygen. We shall refer to this anneal as the "third anneal" or "capacitor anneal". In step P12 a passivation layer may be deposited and the integrated circuit completed. The passivation is preferably either NSG or PSG silicon glass deposited with an APCVD or LPCVD process. The passivation and other layers used are not shown in FIG. 3 as these steps were not completed in most examples to facilitate testing of the capacitors. However these layers are shown in FIG. 9.

3. EXAMPLES

Example 1

Bismuth Titanate Between Buffer Layers of Strontium Titanate $SrTiO_3/Bi_4Ti_3O_{12}/SrTiO_3$ The compounds shown in Table I were measured.

TABLE I

| Compound | FW | g | mmole | Equiv. |
| --- | --- | --- | --- | --- |
| Bismuth 2-ethylhexanoate | (638.61) | 21.2578 | 24.6328 | 4.00000 |
| Titanium Isopropoxide | 284.26 | 5.2517 | 18.4750 | 3.00006 |
| Strontium | 87.62 | 2.8023 | 31.982 | 1.0000 |
| 2-ethylhexanoic acid | 144.21 | 9.2283 | 63.992 | 2.0009 |
| Titanium Isopropoxide | 284.26 | 9.0912 | 31.982 | 1.0000 |

In the above table and the tables below, "FW" indicates formula weight, "g" indicates grams, "mmoles" indicates millimoles, and "Equiv." indicates the equivalent number of moles in solution, bismuth 2-ethylhexanoate indicates a commercially available bismuth solution of bismuth 2-ethylhexanoate in 74% naptha, and the formula weight in parenthesis indicates an equivalent weight of the metal in the solution as a whole, rather than the formula weight of just the metal compound, to take in to account that the metal compound is dissolved in a carrier solvent. For example, in Table I the formula weight of the bismuth 2-ethylhexanoate is placed in parenthesis to indicate that it is an equivalent formula weight of bismuth in the solution as a whole, rather than the formula weight of the just the bismuth 2-ethylhexanoate, to take into account the presence of the naptha. It is noted that this precursor and others discussed below were made at atmospheric pressure at Colorado Springs, Colo. The bismuth 2-ethylhexanoate in naphtha was placed in 90 ml xylenes. The solution was stirred and heated to a maximum temperature of 117° C. to distill out all light hydrocarbon fractions and water. The first measure of titanium isopropoxide was combined with 60 ml of 2-methoxyethanol, and was stirred and heated to a maximum temperature of 116° C. to distill out all water and isopropanol. The bismuth solution and the titanium solution were combined, then heated to a maximum temperature of 136° C. to distill out all 2-methoxyethanol and some xylenes until 60 ml of solution remained. The concentration was 0.1206 moles of $Bi_4Ti_3O_{12}$ per liter with 0.002% excess titanium.

The strontium was placed in the 2-ethylhexanoic acid together with 50 ml 2-methoxyethanol. The solution was stirred and heated to a maximum temperature of 115° C. to distill off all light hydrocarbon fractions and water. The second measure of titanium isopropoxide was dissolved in 50 ml methoxyethanol and stirred and heated to a maximum of 115° C. to distill off the isopropanol and water. The strontium and titanium solutions were combined and stirred and heated to a maximum temperature of 125° C. to distill down to a volume of 60.0 ml. The concentration was 0.533 moles of SrTiO₃ per liter. Just prior to use, a xylene exchange was performed by adding 25 ml of xylenes to 5 ml of the above SrTiO₃ solution and stirred and heated to a maximum temperature of 128° C. to distill out 7 ml to produce a final solution of 23 ml volume and a concentration of 0.116 moles of SrTiO₃ per liter.

The wafer was baked at 140° C. in air for 30 minutes to dehydrate it. An eyedropper was used to place 1 ml of the SrTiO₃ solution on a substrate 28 (FIG. 3) with the layers deposited up to and including the platinum bottom electrode 26. The wafer was spun at 1500 RPM for 20 seconds. The wafer was then placed on a hot plate and baked at 250° C. in air for four minutes. An eyedropper was used to place 1 ml of the $Bi_4Ti_3O_{12}$ solution on the wafer and the wafer was spun at 1500 RPM for 20 seconds. The wafer was placed on a hot plate and baked at 250° C. for 4 minutes. The steps from using an eyedropper to deposit 1 ml of SrTiO₃ solution on the wafer through baking on the hot plate were repeated for another SrTiO₃ layer. The wafer was then transferred to a diffusion furnace and annealed at 700° C. in an oxygen flow of 5 liters/minute for 50 minutes. This produced a metal oxide dielectric layer 27 comprising a layer of bismuth titanate between two layers of strontium titanate; i.e. the layer 27 in this case was actually made up of three different dielectric layers. A top layer 29 of 2000Å platinum was sputtered, a resist was applied, followed by a standard photo mask process, an ion mill etch, an IPC strip and a final contact anneal at 700° C. in an oxygen flow of 5 l/m for 50 minutes.

Hysteresis and polarizability fatigue tests were performed on the sample and it was found that the polarizabilities $P_r^-$ and $P_r^{30}$ remained almost unchanged all the way out past $10^9$ cycles. That is the polarizability switching fatigue, i.e. decline in polarizability as a function of number of switching cycles, was close to zero. This was lower fatigue than demonstrated in any prior art ferroelectric material.

Example 2

R&D GRADE BARIUM STRONTIUM TITANATE

A precursor for R & D grade barium strontium titanate (BST) having the formula $Ba_{0.7}Sr_{0.3}TiO_3$ was formulated as follows. The

TABLE II

| Compound | FW | g | mmole | Equiv. |
|---|---|---|---|---|
| Barium | 137.327 | 9.4255 | 68.635 | 0.69986 |
| 2-ethylhexanoic acid | 144.21 | 19.831 | 137.51 | 1.4022 |
| Strontium | 87.62 | 2.5790 | 29.434 | 0.30014 |
| 2-ethylhexanoic acid | 1.44.21 | 8.5005 | 88.945 | 0.6010 |
| Titanium Isopropoxide | 284.26 | 27.878 | 98.072 | 1.0000 | compounds shown in Table II were measured.
The barium was placed in 100 ml (milliliters) of 2-methoxyethanol, the 2-ethylhexanoic acid was added and the mixture allowed to react while stirring. The step may also be preformed by placing the barium in the 2-methoxyethanol, allowing it to react, adding the 2-ethylhexanoic acid, and stirring while it reacts. The reaction of the barium heated the solution. While the solution was still hot, the strontium was added and allowed to react. When the strontium was all reacted, then the second measure of 2-ethylhexanoic acid was added and, while stirring, the solution was heated to a maximum temperature of 115° C. This ensured that all water was distilled out. The mixture was then allowed to cool, and the titanium isopropoxide was added followed by the addition of enough 2-methoxyethanol to make 220 ml total solution. The solution was then heated and stirred with a maximum temperature of 116° C. The solution was then diluted to 200 ml total solution with additional 2-methoxyethanol. The result was an initial BST precursor of 0.490 Moles concentration with the ratio of barium to strontium equal to 0.69986: 0.30014. Just prior to application, a solvent exchange was performed. Fifteen milliliters (ml) of xylene was added to 3 ml of the above initial precursor, i.e a 5:1 mixture of the initial precursor and xylene was prepared. While stirring, the resulting solution was heated to a maximum of 130° C. until it was distilled down to 4.7 ml. a few drops of acetic acid were added and it was stirred a few minutes then filtered through a 0.2 micrometer syringe filter. The result was a final precursor of 0.32 molarity in a xylene solution.

A DRAM cell capacitor 402 as shown in FIG. 9 was fabricated using the above final precursor and according to the process of FIGS. 1 and 2, i.e. the substrate 407 included a platinum first electrode, a TiN barrier layer, and a Ti adhesion layer. The thickness of the BST film 27 was 140 nm. The temperature of the anneal step P5 was 700° C., the temperature of the anneal step P8 was 750° C., and the temperature of the anneal step P11 was 750° C. The leakage current of the capacitor was measured as a function of voltage and was found to be about $2 \times 10^{-9}$ amps/cm² at a voltage as low as 3 volts, which is the size of the maximum voltages used in state-of-the-art DRAMS. The TDDB characteristics of the fabricated capacitor cell were calculated and the results indicated that the breakdown of the capacitor cell should be over 100 years under a stress voltage of 5 volts. With its dielectric constant of nearly 500, the capacitor according to the invention has a capacitance of 32 femtofarads/micron², which is equivalent to a $SiO_2$ capacitor 1.3 nm thick. Thus the process of the invention is quite practical for memories.

The BST thin films formed by the process of the invention are of nearly the same high quality as bulk BST, unlike the prior art BST thin films. A $Ba_{0.7}Sr_{0.3}TiO_3$ sample made by the process of the invention was examined with a transmission electron microscope (TEM)and it was found that it had a fine grain size of about 40 nm, which was about 3.5 times smaller than the film thickness. As is well-known in the art, grain sizes vary in any material, and thus when we say grain size herein, we mean an average grain size. The excellent quality of the films is believed to be in a large part due to this small grain size.

Example 3

HIGH-PURITY BARIUM STRONTIUM TITANATE

A precursor for high-purity barium strontium titanate (BST) having the formula $Ba_{0.7}Sr_{0.3}TiO_3$ was formulated as follows. The compounds shown in Table III were measured.

The barium solution was a solution of high purity barium

TABLE III

| Compound | FW | g | mmole | Equiv. |
|---|---|---|---|---|
| Barium 2-Ethylhexanoate | (1,401.3) | 78.401 | 55.949 | 0.70000 |
| Strontium 2-Ethylhexanoate | (1,412.2) | 33.861 | 23.977 | 0.30000 |
| Titanium Isopropoxide | 284.26 | 27.878 | 98.072 | 1.0000 |

2-ethylhexanoate in naptha. The strontium solution was a solution of high-purity strontium 2-ethylhexanoate in 2-methoxyethanol. Here "high purity" means that the materials have less than 10 parts per million in impurities. The barium and strontium solutions were combined and 75 ml of 2-methyoxyethanol were added. The solution was heated to a maximum temperature of 118° C. allowing the naptha to distill away. The solution was allowed to cool to room temperature. Then the titanium isopropoxide and 50 ml of additional 2-methoxyethanol were added followed by heating to a maximum temperature of 117° C. while stirring. The final volume was 91 ml, which was diluted to 177 ml by the addition of more 2-methoxyethanol. The concentration was 0.452M (moles/liter).

A 60 ml sample of the solution was diluted to 113 ml by the addition of sufficient 2-methoxyethanol to make 113 ml to yield a solution of 0.239M. This sample was used in a mist deposition at ambient temperature in a vacuum as described in U.S. patent application Ser. No. 07/993,380 to produce thin film capacitors 20 as shown in FIG. 3 which again had better leakage current than any BST produced by prior art processes.

It was found that, for the high-purity solution just described, the preferred solvent for the solvent exchange step 46 was a xylene/n-butyl acetate solution. A pure xylene solvent resulted in poor wetting of the substrate. A pure n-butyl acetate solution resulted in good wetting but the vaporization rate was too high to produce good microstructure in the film.

The xylene/n-butyl acetate exchange was performed as follows. An amount of xylene equal to five times the volume of the initial BST solution of 0.452M concentration described above was added. The solution was heated to a maximum temperature of about 120° C. and distilled down to a 0.4M concentration. Then enough n-butyl acetate was added to the 0.4M solution to arrive at a 0.176M concentration final precursor. For example, 1.76 ml of the 0.4M BST solution was combined with 2.24 ml of n-butyl acetate to produce 4 ml of the 0.176M concentration solution. The solution was stirred without heating and filtered through a 0.2 micrometer syringe filter prior to spinning. Thin film capacitors 20 as shown in FIG. 3 which again had better leakage current than any BST produced by prior art processes were made by the process described in reference to FIG. 1.

In making samples of various thickness, it was found that the higher the concentration of the final solution, the thicker the resultant film. With a given starting concentration, this can affect the ratio of n-butyl acetate. Thus it is usually better to use several spin coat steps as indicated in FIGS. 2 and 4 to build up several layers if a thicker film is desired.

Example 4

BARIUM STRONTIUM TITANATE FROM All CARBOXYLATE PRECURSORS

In Examples 2 and 3 above, a variant of the process of FIG. 6 was used to fabricate a BST dielectric. In the following example, an all carboxylate process as shown in FIG. 4 is used. A precursor for barium strontium titanate (BST) having the formula $Ba_{0.7}Sr_{0.3}TiO_3$ was formulated as follows. The compounds shown in Table IV were

TABLE IV

| Compound | FW | g | mmole | Equiv. |
|---|---|---|---|---|
| Barium | 137.327 | 2.7999 | 21.000 | 0.7000 |
| 2-ethylhexanoic acid | 144.21 | 6.0568 | 42.000 | 1.4000 |
| Strontium | 87.62 | 0.7886 | 9.0000 | 0.3000 |
| 2-ethylhexanoic acid | 1.44.21 | 2.5958 | 18.000 | 0.6000 |
| Titanium Isopropoxide | 284.26 | 8.5278 | 30.000 | 1.0000 |
| 2-ethylhexanoic acid | 144.21 | 8.6526 | 60.000 | 2.0000 | measured.

The barium was combined with 50 ml 2-methoxyethanol and 10 ml of propanol was used to rinse the beaker in which the barium was weighed and added to the solution. After about 2 minutes of reaction, the first measure of 2-ethylhexanoic acid was added. Again the 10 ml of propanol was used to rinse the beaker in which the 2-ethylhexanoic acid was measured. After the reaction was complete, the solution was then heated to a maximum temperature of 114° C. to distill out the light hydrocarbon fractions, and then the solution was cooled to under 40° C. A strontium initial precursor was made in the same way utilizing the strontium and the second measure of 2-ethylhexanoic acid, the only difference being that during the reaction of the 2-ethylhexanoic acid, the solution was heated to about 40° C. The titanium isopropoxide was added to 50 ml 2-methoxyethanol, then another 20 ml of 2-methoxyethanol was used to rinse the beaker in which the titanium isopropoxide was measured and added to the solution. The third measure of 2-ethylhexanoic acid was added followed by 10 ml of isopropanol that was used to rinse the beaker in which the 2-ethylhexanoic acid was measured. After the reaction was complete, the solution was then heated to a maximum temperature of 114° C. to distill out the light hydrocarbon fractions, and then the solution was cooled to under 40° C. The strontium solution was added to the barium solution along with additional propanol used to rinse the strontium solution flask, and the resulting solution distilled down to about 60.0 ml while stirring, then cooled to under 40° C. In cases where the total volume was significantly less than 60 ml, additional 2-methoxyethanol was added and mixed well to get 60 ml. The solution was filtered through a 0.2 micrometer syringe filter, then a xylenes exchange was performed; xylenes in an amount equal to 5 times the solution was added and the result distilled down to 75 ml of 0.4M concentration solution. Then the solution was cooled to under 40° C. If the solution was short in volume additional xylenes to reach 75 ml was added and mixed well by stirring. The solution was again filtered and then stored under dry nitrogen. Just prior to spinning, the solution was diluted with n-butyl acetate to a molarity of 0.176, that is, 4.4 ml of the 0.4 ml xylened based solution was diluted with n-butyl acetate to make 10 ml of the 0.176M final precursor. Since the n-butyl acetate is slightly water sensitive, it is preferable to wait until just before use to dilute to the final precursor, and to do the spinning and drying steps under a dry atmosphere, i.e less than 50% humidity. After dilution, the precursor was filtered through a 0.2 micrometer syringe filter just prior to spinning. Thin film Capacitors 20 were fabricated with the precursor and again had far better leak-

Example 5

STRONTIUM TITANATE—SrTiO$_3$

TABLE V

| Compound | FW | g | mmole | Equiv. |
| --- | --- | --- | --- | --- |
| Strontium | 87.62 | 2.6286 | 30.000 | 1.0000 |
| 2-ethylhexanoic acid | 1.44.21 | 8.6526 | 60.000 | 2.0000 |
| Titanium Isopropoxide | 284.26 | 8.5278 | 30.000 | 1.0000 |

The compounds shown in Table V were measured. The strontium was placed in 50 ml 2-methoxyethanol, was reacted for ten minutes, and then 10 ml of 2-propanol was used to wash out the beaker in which strontium had been weighed (to be sure all the strontium was reacted) was added along with the 2-ethylhexanoic acid, and the solution was stirred and heated to about 40° C. During the reaction, another 10 ml of 2-propanol was used to wash out the 2-ethylhexanoic acid beaker and was added. After the reaction was completed, the solution was stirred and heated to a maximum of 114° C. to distill out all light fractions and water. The titanium was placed in another flask and 70 ml of 2-methoxyethanol was added. The solution was stirred and heated to a maximum temperature of 114° C. The strontium solution was added to the titanium solution followed by 5 ml of 2-propanol used to wash out the strontium beaker, and the result was distilled down to 60.0 ml. The resulting 0.5M (mole/liter) initial precursor was filtered through a 0.2 micrometer syringe filter and stored under N$_2$ gas. Just prior to application, a few drops of acetic acid were added to 14 ml xylene and stirred for a few minutes, then 2.8 ml of the 0.5M initial precursor was added to the 14 ml xylene, stirred while heating to a maximum temperature of 130° C., and distilled down to a volume of 5 ml to produce a final precursor of molarity 0.28M. The final solution was filtered through a 0.2 micrometer syringe filter prior to application. Strontium titanate capacitors were prepared as described above from the final precursor solution via spin coating at 1500 rpm and furnace annealing in step P8 at between 600° C. and 650° followed by rapid thermal processing at about 600° C. The samples were tested and found to have dielectric constants on the order of 200 and leakage currents below 10$^{-9}$ amps/cm for voltages of the order of 2 volts.

Example 6

BARIUM TITANATE —BaTiO$_3$

TABLE VI

| Compound | FW | g | mmole | Equiv. |
| --- | --- | --- | --- | --- |
| Barium | 137.327 | 4.1198 | 30.000 | 1.0000 |
| 2-ethylhexanoic acid | 1.44.21 | 8.6526 | 60.000 | 2.0000 |
| Titanium Isopropoxide | 284.26 | 8.5278 | 30.000 | 1.0000 |

The compounds shown in Table VI were measured. The barium was placed in 50 ml 2-methoxyethanol, was reacted for two minutes, and then 10 ml of 2-propanol was used to wash out the beaker in which barium had been weighed (to be sure all the strontium was reacted) was added along with the 2-ethylhexanoic acid and the solution was stirred and heated to about 40° C. During the reaction, another 10 ml of 2-propanol was used to wash out the 2-ethylhexanoic acid beaker and was added. After the reaction was completed, the solution was stirred and heated to a maximum of 114° C. to distill out all light fractions and water. The titanium was placed in another flask and 70 ml of 2-methoxyethanol was added. The solution was stirred and heated to a maximum temperature of 114° C. The strontium barium was added to the titanium solution followed by 5 ml of 2-propanol used to wash out the barium beaker, and the result was distilled down to 60.0 ml. The resulting 0.5M (mole/liter) initial precursor was filtered through a 0.2 micrometer syringe filter and stored under N$_2$ gas. Just prior to application, a few drops of acetic acid were added to 14 ml xylene and stirred for a few minutes, 2.8 ml of the 0.5M initial precursor was added to the 14 ml xylene, stirred while heating to a maximum temperature of 130° C., and distilled down to a volume of 5 ml to produce a final precursor of molarity 0.28M. The final precursor solution was filtered through a 0.2 micrometer syringe filter prior to application. Using the final precursor solution, barium titanate capacitors were fabricated as described above and again found to have excellent properties.

Example 7

Strontium Bismuth Tantalate—SrBi$_2$Ta$_2$O$_9$

TABLE VII

| Compound | FW | g | mmole | Equiv. |
| --- | --- | --- | --- | --- |
| Tantalum ethoxide | 406.26 | 4.9553 | 12.197 | 2.0000 |
| 2-ethylhexanoic acid | 144.21 | 8.7995 | 61.019 | 10.006 |
| Strontium | 87.62 | 0.5330 | 6.0831 | 0.9975 |
| 2-ethylhexanoic acid | 144.21 | 1.7613 | 12.213 | 2.0026 |
| Bismuth 2-ethylhexanoate | (862.99) | 10.525 | 12.196 | 1.9998 |

The compounds shown in Table VII were measured. The strontium was combined with the first measure of 2-ethylhexanoic acid and 80 ml 2-methoxyethanol. The mixture was stirred on low heat of between about 70° C. and 90° C. to hurry the reaction rate. When all the strontium was reacted and the solution had cooled to approximately room temperature, the tantalum ethoxide followed by the second measure of 2-ethylhexanoic acid were added. The mixture was stirred and heated to a maximum temperature of 115° C. to distill out ethanol and water. Then 75 ml xylenes followed by the bismuth 2-ethylhexanoate were added. The solution was stirred and heated with a maximum temperature of about 125° C. until only 60.0 ml of solution remained. The concentration was 0.102 moles of SrBi$_2$Ta$_2$O$_9$ per liter. The wafer was baked at 140° C. in air for 30 minutes to dehydrate it. An eyedropper was used to place 1 ml of the SrBi$_2$Ta$_2$O$_9$ solution on a wafer as in FIG. 2C with the layers deposited up to and including the platinum bottom electrode 28. The wafer was spun at 1500 RPM for 20 seconds. The wafer was then placed on a hot plate and baked at about 250° C. in air for three minutes. The steps from using an eyedropper to deposit solution on the wafer through baking on the hot plate were repeated for another layer. The wafer was then transferred to a diffusion furnace and annealed at 750° C. in an oxygen flow of 5 l/m for 2 hours. The top layer 32 of 2000 Å platinum was sputtered, a resist was applied, followed by a standard photo mask process, an ion mill etch, an IPC strip and a final contact anneal at 750° C. in an oxygen flow of 5 l/m for 30 minutes. The resulting sample was tested and very little change in the hysteresis curves were found out to about $10^{10}$ cycles, demonstrating low-fatigue. Moreover, the polarizabilty was much higher than the polarizability measured for thin films of the material made by prior art processes.

Hysteresis curves were very boxy and vertical, indicating that samples would make excellent integrated circuit ferroelectric memories. A measurement of 2 Prp and 2 Prn over $10^{10}$ cycles, derived from a PUND switching test, showed negligible fatigue over the entire $10^{10}$ cycles. These results are phenomenal when compared to the prior art materials, and indicate that this layered superlattice material would last indefinitely in a ferroelectric switching memory. The results are reported in more detail in U.S. patent application Ser. No. 08/154,760 which is incorporated herein by reference.

Example 8

Strontium Bismuth Tantalate—$SrBi_{2.18}Ta_2O_9$

TABLE VIII

| Compound | FW | g | mmole | Equiv. |
|---|---|---|---|---|
| Tantalum butoxide | 546.52 | 52.466 | 95.989 | 2.0000 |
| 2-ethylhexanoic acid | 144.21 | 73.900 | 512.447 | 10.6800 |
| Strontium | 87.62 | 4.2052 | 47.994 | 1.0000 |
| 2-ethylhexanoic acid | 144.21 | 13.855 | 96.075 | 2.0018 |
| Bismuth 2-ethylhexanoate | (638.61) | 78.821 | 123.4259 | 2.1800 |

This example demonstrates an alternative process for forming the strontium bismuth tantalate precursor in which the second solvent is added in with the initial precursor with the first metal and the distillation off of the first solvent was not performed until after the addition of a second metal. It also illustrates the use of a "cold mix" process in which the solution is not hot when the bismuth is added and is not heated thereafter. The compounds shown in Table VIII were measured. The tantalum was combined with the first measure of 2-ethylhexanoic acid and about 25 ml to 30 ml of xylenes was added. Generally from about 0.5 ml to 1 ml of xylenes per mmole of tantalum butoxide is used. This mixture was stirred on a hot plate for from 36 to 60 hours, preferably 48 hours, with the hot plate being gradually raised from 75° C. to 185° C. with the beaker capped; i.e. there was no distillation in this step, and thus the resulting solution included both butanol and xylene as solvents. The mixture was then cooled to room temperature and the strontium was added. The second measure of 2-ethylhexanoic acid was added. This amount is approximately 5% more than is necessary to complete the reaction; the excess increases the reaction speed. The solution was heated on a hot plate at about 185° C. for about 1 to 1.5 hours, then the temperature of the hot plate was raised to 200° C. or more and the butanol was boiled from the solution, which reached a maximum temperature of 122° C. The solution was removed from the hot plate and cooled to room temperature. It is important that the solution be at or below 30° C. before the next step of adding the bismuth initial precursor. The bismuth 2-ethylhexanoate was added, then the solution was diluted to a concentration of about 0.2 mol/l with xylenes. It is noted that the solution was not heated at this point as heating during the reaction can cause precipitation of the bismuth compound.

Example 9

Strontium Bismuth Tantalate—$SrBi_{2.18}Ta_2O_9$

Example 9 is the same as Example 8 except that the precursor was not cooled to 30° C. before adding the bismuth 2-ethylhexanoate, and was heated to 125° C. with stirring after the addition of the bismuth 2-ethylhexanoate.

Precursor solutions made as described in Examples 8 and 9 above were used in a process as described above in the discussion of FIG. 1 to produce thin film capacitors 20 as shown in FIG. 3 having a strontium bismuth tantalate dielectric 27. We shall refer to the samples made with a precursor solution made by the process of Example 8 as "cold mix" capacitors and samples made with a precursor solution made by the process of Examples 7 and 9 as "hot mix" capacitors. When samples in both cases were tested for fatigue, the results were again as good as the phenomenal results found for the materials made with the process of Example 7. The results for the other electrical properties, such as coercive voltage and polarizability, were close to the results for the materials made as described in Example 7, with the results for the "cold mix" capacitors about 10% better than the results for the "hot mix" capacitors. Moreover, it was found that the precursor solution made with the process of Example 8 is more stable than the precursor solutions made with the processes of Examples 7 and 9, i.e. processes in which the precursor was hot when the bismuth compound was added, and/or the precursor was heated after the bismuth compound was added. That is, the "cold mix" precursor remained clear and did not develop cloudiness as readily as precursors made with previous processes. In addition, the incidence of shorts being present after fabrication of the capacitors 20 decreased significantly resulting in a better yield of high grade capacitors.

The results of measurements of coercive field, Ec, and polarizabilty, Pr, versus voltage for a thin film capacitor made by the process of Example 8 are shown in Table IX and the results of measurements of coercive voltage, Ec, and polarizabilty, Pr, versus voltage for a thin film capacitor made by the process of Example 9 are shown in Table X. In these tables, −Ec and −Pr are the coercive field and polarizabilty respectively for negative voltages on the hysteresis curve, while +Ec and −Pr are the coercive field and polarizabilty respectively measured for positive voltages on the hysteresis curve, while 2Ec and 2Pr are the differences between the respective negative and positive measurements. The results for 3 volts are underlined since that is the voltage that state-of-the-art memories generally use.

TABLE IX

| Amp (Volts) | −Ec (KV/cm) | +Ec (KV/cm) | 2Ec (KV/cm) | −Pr (uC/cm2) | +Pr (uC/cm2) | 2Pr (uC/cm2) |
|---|---|---|---|---|---|---|
| .25 | −1.11E+0 | +1.51E+0 | +2.62E+0 | −4.75E−2 | +2.99E−2 | +7.74E−2 |
| .50 | −5.71E+0 | +7.27E+0 | +1.30E+1 | −3.18E−1 | +2.45E−1 | +5.64E−1 |
| 1.00 | −2.68E+1 | +2.70E+1 | +5.38E+1 | −2.59E+0 | +2.53E+0 | +5.13E+0 |
| 1.50 | −3.48E+1 | +3.55E+1 | +7.02E+1 | −4.59E+0 | +5.38E+0 | +9.03E+0 |
| 2.00 | −3.84E+1 | +3.79E+1 | +7.63E+1 | −5.44E+0 | +5.38E+0 | +1.08E+1 |
| 2.50 | −3.99E+1 | +3.99E+1 | +7.98E+1 | −5.95E+0 | +5.87E+0 | +1.18E+1 |
| 3.00 | −4.10E+1 | +4.15E+1 | +8.24E+1 | −6.25E+0 | +6.26E+0 | +1.25E+1 |
| 4.00 | −4.07E+1 | +4.51E+1 | +8.57E+1 | −6.80E+0 | +6.42E+0 | +1.32E+1 |
| 5.00 | −4.15E+1 | +4.60E+1 | +8.74E+1 | −6.90E+0 | +6.63E+0 | +1.35E+1 |
| 7.00 | −4.33E+1 | +4.63E+1 | +8.97E+1 | −7.03E+0 | +6.82E+0 | +1.39E+1 |

TABLE IX

| Amp (Volts) | −Ec (KV/cm) | +Ec (KV/cm) | 2Ec (KV/cm) | −Pr (uC/cm2) | +Pr (uC/cm2) | 2Pr (uC/cm2) |
|---|---|---|---|---|---|---|
| .25 | −1.54E+0 | +1.79E+0 | +3.33E+0 | −7.33E−2 | +4.71E−2 | +1.20E−1 |
| .50 | −9.48E+0 | +9.07E+0 | +1.86E+1 | −5.03E−1 | +5.07E−1 | +1.01E+0 |
| 1.00 | −2.95E+1 | +2.87E+1 | +5.82E+1 | −3.76E+0 | +3.60E+0 | +7.36E+0 |
| 1.50 | −3.55E+1 | +3.41E+1 | +6.96E+1 | −5.51E+0 | +5.31E+0 | +1.08E+1 |
| 2.00 | −3.73E+1 | +3.57E+1 | +7.31E+1 | −6.22E+0 | +6.09E+0 | +1.23E+1 |
| 2.50 | −3.90E+1 | +3.78E+1 | +7.68E+1 | −6.65E+0 | +6.50E+0 | +1.32E+1 |
| 3.00 | −3.95E+1 | +3.87E+1 | +7.82E+1 | −6.88E+0 | +6.73E+0 | +1.36E+1 |
| 4.00 | −3.67E+1 | +4.39E+1 | +8.06E+1 | −7.46E+0 | +6.86E+0 | +1.43E+1 |
| 5.00 | −3.75E+1 | +4.37E+1 | +8.12E+1 | −7.48E+0 | +6.92E+0 | +1.44E+1 |
| 7.00 | −3.88E+1 | +4.46E+1 | +8.34E+1 | −7.52E+0 | +7.11E+1 | +1.46E+1 |

The results shown in Tables IX and X indicate that in each instance the measurements for the capacitors made with the "cold mix" solvent were higher. As an example, the 2 Pr measurement for the "hot mix" at 3 volts, was 12.5 microcoulombs/centimeter squared, while for the "cold mix" it was 13.6 microcoulombs/centimeter squared or about 10% higher. While two of the four "hot mix" capacitors tested showed some degree of shorting, none of the four "cold mix" capacitors tested showed any evidence of shorting.

A process as described in Example 8, in which the solution was cooled to 30° C. or below before adding the bismuth precursor, and was not heated thereafter, was also used to fabricate dielectrics 27 of strontium bismuth niobate, and strontium bismuth tantalum niobate in capacitors 20 such as shown in FIG. 3. It again was found that the precursor was much more stable than precursors made with the processes of Examples 7 and 9. The yield of good performing capacitors again increased as compared to the processes of Examples 7 and 9, and in particular the incidence of shorts decreased. Other properties, such as polarizability and coercive voltage were again somewhat higher than for materials made with the processes of Examples 7 and 9.

Other strontium bismuth tantalate, strontium bismuth niobate, and strontium bismuth tantalum niobate capacitors were made with a process as described in Example 8, except additional xylenes were added following the strontium and the 2-ethylhexanoic acid. The results were similar.

A feature of invention is that a process in which the bismuth precursor is added to a cool solution and the solution is not heated subsequently, has proved to be more consistent than previous processes in providing high quality thin films and electronic devices.

It is another feature of the invention that the precursor remains a liquid from the time of the formation of the initial precursor until the application of the precursor to the substrate. In some prior art processes, a carboxylate precursor was formed, dried to a solid or semisolid, then redissolved in xylenes. This does not result in thin films of good enough quality for use in integrated circuits, although the reason is not entirely understood at present.

A related feature of the invention is that the initial precursor generally includes a liquid that both reacts with the metal that is to eventually form the oxide and also dissolves the reactant. This is believed to lead to more complete dissolving of the precursor metal-oxide compounds in the solvent.

Another feature of the invention is that the second solvent, that is, the solvent that replaces the solvent of the initial precursor in the solvent exchange, generally does not react with the metal compounds in solution. Thus the second solvent does not have to break chemical bonds when disassociating from the metal oxide in the thin film, but rather can simply evaporate.

Another feature of the invention is that the second solvent has a higher boiling point than the first solvent, which allows it to remain behind in the solvent exchange, and also causes it to disassociate from the solution slower in the drying and annealing steps. This is believed to result in denser thin films with less imperfections.

It is further believed that the solvent exchange process provides an opportunity for the initial solvent to completely react with the metal, and also provides an opportunity for whatever remains of the initial solvent, after the complete reaction, to evaporate from the solution. The former effect, the complete reaction, results in a more uniform distribution of the metal-oxide bonds in the solution, and the latter effect, the removal of the initial solvent that has not reacted, prevents inhomogeneities due to undesirable reactions from developing during the drying and annealing processes.

Another feature of the invention is that the second solvent wets the substrate better than the first solvent and has a better viscosity for spin-coating, thus resulting in a denser thin film with fewer imperfections. There has been described novel processes for fabricating integrated circuit utilizing metal oxide thin films. It should be understood that the particular embodiments shown in the drawings and described within this specification are for purposes of example and should not be construed to limit the invention. Further, it is evident that those skilled in the art may now make numerous uses and modifications of the specific embodiment described, without departing from the inventive concepts. For example, the same process can be used with many other materials. Strontium bismuth niobate, strontium bismuth tantalum niobate, barium bismuth tantalate, lead bismuth tantalate, and barium bismuth niobate are some examples of other materials that have been made using the processes of the invention. Further, it is evident that now that the benefits of the solvent exchange process have been shown, and the desirable characteristics of the first and second solvents have been defined, other solvents may be used for either the first solvent, the second solvent, of both. It is also evident that the process steps recited may in some instances be performed in a different order. Or equivalent structures and processes may be substituted for the various structures and processes described. The structures and processes may be combined with a wide variety of other structures and processes.

We claim:

1. A method of fabricating a metal oxide thin film for use in an integrated circuit comprising the steps of:

providing an integrated circuit substrate;

providing an initial liquid precursor comprising at least one metal compound dissolved in a first solvent;

adding a second solvent to said initial liquid precursor to form an intermediate precursor, said second solvent having a boiling point greater than that of said first solvent;

heating said intermediate liquid precursor to distill off said first solvent and form a final liquid precursor that is capable of forming a metal oxide thin film having better electrical properties than the thin films formed by said initial precursor;

applying said final liquid precursor to said substrate; and treating said final precursor on said substrate to form a thin film of said metal oxide.

2. A method as in claim 1 wherein said step of providing said initial liquid precursor includes providing said first solvent as a liquid that reacts with said metal and said step of adding said second solvent includes adding said second solvent as a liquid that does not react with said metal.

3. A method as in claim 1 wherein said step of heating said intermediate liquid precursor yields a final precursor liquid that wets said substrate in said step of applying said final liquid precursor to said substrate better than would said initial precursor liquid.

4. A method as in claim 1 wherein said step of providing said initial liquid precursor includes providing said metal compound from the group consisting of metal carboxylates, metal alkoxides, and metal alkoxycarboxylates.

5. A method as in claim 1 wherein said step of providing said initial liquid precursor includes providing said initial liquid precursor to yield, in said step of treating, a material selected from the group consisting of barium strontium titanate, strontium titanate, barium titanate, bismuth titanate, strontium bismuth tantalate, strontium bismuth niobate, strontium bismuth tantalum niobate, barium bismuth tantalate, lead bismuth tantalate, barium bismuth niobate, and mixtures thereof.

6. A method as in claim 1 wherein said step of adding a second solvent includes adding said second solvent as a liquid selected from the group consisting of xylenes and n-butyl acetate.

7. A method as in claim 6 wherein said first solvent in said step of providing an initial liquid precursor is 2-methoxyethanol and said second solvent in said step of adding a second solvent is xylene.

8. A method as in claim 6 wherein said second solvent in said step of adding a second solvent comprises xylene and n-butyl acetate.

9. A method as in claim 1 wherein said step of applying said frinal liquid precursor comprises spin-coating said final precursor liquid onto said substrate.

10. A method of fabricating a metal oxide thin film for use in an integrated circuit comprising the steps of:

providing an integrated circuit substrate;

providing an initial liquid precursor comprising at least one metal compound dissolved in a first solvent and a second solvent, said second solvent having a boiling point greater than that of said first solvent;

heating said initial liquid precursor to distill off said first solvent and form a final liquid precursor that is capable of forming a metal oxide thin film having better electrical properties than the thin films formed by a precursor including said first solvent;

applying said final liquid precursor to said substrate; and treating said final precursor on said substrate to form a thin film of said metal oxide.

11. A method as in claim 10 wherein said step of providing an initial liquid precursor includes providing said first solvent as a liquid that reacts with said metal and said step of adding a second solvent includes adding said second solvent as a liquid that does not react with said metal.

12. A method as in claim 10 wherein said step of providing an initial liquid precursor includes providing said metal compound as one selected from the group consisting of metal carboxylates, metal alkoxides, and metal alkoxycarboxylates.

13. A method as in claim 10 wherein said step of providing an initial liquid precursor includes providing said initial liquid precursor to yield, in said step of treating said metal oxide selected from the group consisting of barium strontium titanate, strontium titanate, barium titanate, bismuth titanate, strontium bismuth tantalate, strontium bismuth niobate, strontium bismuth tantalum niobate, barium bismuth tantalate, lead bismuth tantalate, barium bismuth niobate, and mixtures thereof.

14. A method as in claim 10 wherein said step of providing an initial liquid precursor includes providing said second solvent as a liquid selected from the group consisting of xylenes and n-butyl acetate.

15. A method as in claim 14 wherein said first solvent in said step of providing an initial liquid precursor is 2-methoxyethanol and said second solvent is xylene.

16. A method as in claim 10 wherein said step of applying said final liquid precursor comprises spin-coating said final liquid precursor onto said substrate.

17. A method of fabricating a metal oxide thin film for use in an integrated circuit, said method comprising the steps of:

providing an integrated circuit substrate and a liquid precursor comprising a metal compound dissolved in an alcohol and a second solvent, said second solvent having a boiling point greater than that of said alcohol;

heating said liquid precursor to distill off said alcohol and form a final liquid precursor comprising said metallic compound dissolved in said second solvent;

applying said final liquid precursor to said substrate; and treating said precursor on said substrate to evaporate said second solvent and form a thin film of said metal oxide.

18. A method as in claim 17 wherein said step of providing a liquid precursor comprises the steps of:

reacting a metal or a metallic compound with said first solvent to form an initial liquid precursor comprising a reactant dissolved in said first solvent; and adding a said second solvent to said initial liquid precursor.

19. A method as in claim 17 wherein said step of providing an initial liquid precursor includes providing said alcohol selected from the group consisting of 2-methoxyethanol and isopropanol.

20. A method as in claim 19 wherein said alcohol is 2-methoxyethanol.

21. A method as in claim 17 wherein said step of providing an initial liquid precursor includes providing said second solvent as xylene.

22. A method as in claim 17 wherein said step of applying said final liquid precursor comprises spin-coating said final liquid precursor onto said substrate.

23. A method as in claim 17 wherein said step of treating comprises drying said final precursor on said substrate.

24. A method as in claim 23 wherein said step of treating comprises annealing said thin film.

25. A method as in claim 17 wherein said step of providing an initial liquid precursor includes providing said metal compound from the group consisting of metal carboxylates, metal alkoxides, and metal alkoxycarboxylates.

26. A method as in claim 17 wherein said step of providing an initial liquid precursor includes a step of selecting said liquid precursor to yield, in said treating step, said metal oxide selected from the group consisting of barium strontium titanate, strontium titanate, barium titanate, bismuth titanate, strontium bismuth tantalate, strontium bismuth niobate, strontium bismuth tantalum niobate, barium bismuth tantalate, lead bismuth tantalate, barium bismuth niobate, and mixtures thereof.

27. A method of making a final liquid precursor for use in manufacturing metal oxide thin films for use in integrated circuits, said method comprising the steps of:

providing an initial liquid precursor comprising an oxygenated metal moiety dissolved in a first solvent; and performing a solvent exchange step on said initial liquid precursor to form said final precursor, wherein said step of performing a solvent exchange includes adding a second solvent to said initial liquid precursor, said second solvent having a boiling point greater than that of said first solvent and heating said initial liquid precursor to remove said first solvent.

28. A method of making a precursor as in claim 27 wherein said solvent exchange step comprises adding a second solvent to said liquid initial precursor and distilling off said first solvent.

29. A method of making a precursor as in claim 27 wherein said step of providing an initial liquid precursor includes providing said first solvent selected from the group consisting of carboxylic acids and alcohols.

30. A method of making a precursor as in claim 27 wherein said step of performing a solvent exchange includes adding to said initial liquid precursor a second solvent selected from the group consisting of xylenes and n-butyl acetate.

31. A method of making a precursor as in claim 27 wherein said step of providing an initial liquid precursor includes providing said initial liquid precursor from the group consisting of metal carboxylates, metal alkoxides, and metal alkoxycarboxylates.

32. A method of making a precursor as in claim 27 wherein said step of providing an initial liquid precursor includes providing said initial liquid precursor to yield in a subsequent anneal said metal oxide selected from the group consisting of barium strontium titanate, strontium titanate, barium titanate, bismuth titanate, strontium bismuth tantalate, strontium bismuth niobate, strontium bismuth tantalum niobate, barium bismuth tantalate, lead bismuth tantalate, barium bismuth niobate, and mixtures thereof.

33. A method of making a final liquid precursor for use in manufacturing metal oxide thin films for use in integrated circuits, said method comprising the steps of:

providing an initial liquid precursor comprising an oxygenated metallic moiety dissolved in a first solvent, said first solvent having a boiling point less than that of xylene; and performing a xylene exchange step on said initial liquid precursor to form said final precursor.

34. A method of making a precursor as in claim 33 wherein said step of providing an initial liquid precursor includes providing said oxygenated metal moiety from the group consisting of metal carboxylates, metal alkoxides, and metal alkoxycarboxylates.

35. A method as in claim 33 wherein said step of providing an initial liquid precursor includes providing said initial liquid precursor to yield in a subsequent anneal said metal oxide selected from the group consisting of barium strontium titanate, strontium titanate, barium titanate, bismuth titanate, strontium bismuth tantalate, strontium bismuth niobate, strontium bismuth tantalum niobate, barium bismuth tantalate, lead bismuth tantalate, barium bismuth niobate, and mixtures thereof.

36. A method as in claim 33 wherein said step of providing an initial liquid precursor includes providing said first solvent from the group consisting of carboxylic acids and alcohols.

37. A method of fabricating a metal oxide thin film containing bismuth for use in an integrated circuit, said method comprising the steps of:

providing an integrated circuit substrate;

providing a non-bismuth metal compound solution comprising a plurality of ingredients selected from a group consisting of non-bismuth metal alkoxides, non-bismuth metal carboxylates, and non-bismuth metal alkoxycarboxylates dissolved in a solvent;

heating said non-bismuth metal compound solution to a temperature exceeding 30° C.;

providing a bismuth solution comprising a bismuth compound in a second solvent;

adding said bismuth solution to said metal compound solution to form said liquid precursor and; thereafter maintaining said bismuth solution and said liquid precursor at a temperature of 30° C. or less until said treating step below;

applying said liquid precursor to said integrated circuit substrate; and treating said final precursor on said substrate to form a thin film of said metal oxide.

38. A method as in claim 37 wherein said step of providing an initial liquid precursor includes providing said non-bismuth metal compound solution to yield, after said step of adding said bismuth compound and in said treating step, said metal oxide selected from the group consisting of strontium bismuth tantalate, strontium bismuth niobate, and strontium bismuth tantalum niobate.

39. A method of making a liquid precursor for use in manufacturing metal oxide thin films containing bismuth for use in integrated circuits, said method comprising the steps of:

providing a non-bismuth metal compound solution at a temperature of greater than 30° C., said non-bismuth metal compound solution comprising an oxygenated metallic moiety dissolved in a solvent;

cooling said non-bismuth metal compound solution to 30° C. or below;

providing a bismuth solution comprising a bismuth compound in a solvent; and adding said bismuth solution to said cooled metal compound solution to form said precursor.

40. A method as in claim 39 wherein said metallic moiety includes a metal selected from the group consisting of strontium, tantalum, and niobium.

* * * * *